United States Patent [19]
Saito

[11] Patent Number: 5,923,071
[45] Date of Patent: Jul. 13, 1999

[54] SEMICONDUCTOR DEVICE HAVING A SEMICONDUCTOR FILM OF LOW OXYGEN CONCENTRATION

[75] Inventor: Yutaka Saito, Tokyo, Japan

[73] Assignee: Seiko Instruments Inc., Japan

[21] Appl. No.: 08/127,822

[22] Filed: Sep. 27, 1993

Related U.S. Application Data

[63] Continuation-in-part of application No. 08/072,551, Jun. 7, 1993, abandoned.

[30] Foreign Application Priority Data

Jun. 12, 1992 [JP] Japan .................................... 4-153722

[51] Int. Cl.$^6$ .......................... H01L 29/36; H01L 27/144; H01L 31/0392; H01L 31/078
[52] U.S. Cl. .......................... 257/458; 257/438; 257/447; 257/460; 257/446; 257/448; 257/347; 257/914; 257/466; 257/463; 257/443
[58] Field of Search .................................. 257/447, 460, 257/914, 458, 347, 446–448, 438, 466, 463, 443

[56] References Cited

U.S. PATENT DOCUMENTS

| | | | |
|---|---|---|---|
| 3,748,546 | 7/1973 | Allison ..................................... | 257/447 |
| 4,435,447 | 3/1984 | Ito et al. ..................................... | 427/94 |
| 4,649,408 | 3/1987 | Sekine et al. ........................... | 257/229 |
| 4,857,980 | 8/1989 | Hoeberechts ........................... | 257/436 |
| 4,951,104 | 8/1990 | Kato et al. ............................... | 257/230 |
| 4,954,856 | 9/1990 | Yamazaki ................................ | 257/458 |
| 5,122,669 | 6/1992 | Herring et al. ..................... | 250/370.14 |
| 5,198,371 | 3/1993 | Li .............................................. | 437/11 |
| 5,220,191 | 6/1993 | Matsushita ............................... | 257/499 |
| 5,233,211 | 8/1993 | Hayashi et al. ......................... | 257/347 |
| 5,241,210 | 8/1993 | Nakagano et al. ...................... | 257/487 |
| 5,280,189 | 1/1994 | Schüppert et al. ..................... | 257/458 |
| 5,313,092 | 5/1994 | Tsuruta et al. .......................... | 257/620 |
| 5,315,134 | 5/1994 | Ogura et al. ............................ | 257/138 |
| 5,327,007 | 7/1994 | Imura et al. ............................ | 257/610 |
| 5,347,154 | 9/1994 | Takahashi et al. ..................... | 257/347 |

FOREIGN PATENT DOCUMENTS

| | | |
|---|---|---|
| 0518325 | 12/1992 | European Pat. Off. . |
| 60-136218 | 7/1985 | Japan . |
| 63-55980 | 3/1988 | Japan . |
| 2-46770 | 2/1990 | Japan . |

OTHER PUBLICATIONS

Radio Fernsehen Elektronik, vol. 33, No. 2, Feb. 1984, Berlin, Germany, pp. 71–74, H.F. Hadamovsky "Werkstoffentwicklung für die Mikroele.cktronik".

Applied Physics Letters, vol. 46, No. 7 Apr. 1985, New York USA, pp. 673–675, N. Nauka et al. "Intrinsic Gettering in Oxygen–Free Silicon".

*Primary Examiner*—John Guay
*Attorney, Agent, or Firm*—Adams & Wilks

[57] ABSTRACT

A semiconductor substrate having a silicon-on-insulator structure may achieve superior performance by utilizing a low oxygen content monocrystalline silicon thin film layer for device formation. A supporting substrate, which may comprise a transparent material, such as quartz, or which may be silicon, has an insulating film disposed thereover. The insulating film preferably has a lower diffusion coefficient with respect to impurities than the monocrystalline silicon thin film, which is provided thereover. In accordance with this structure, oxygen particles are not introduced into the monocrystalline thin film and the thin film has a low oxygen concentration to maximize the minority carrier lifetime, enhance device performance characteristics, and prevent the occurrence of latch up.

1 Claim, 20 Drawing Sheets

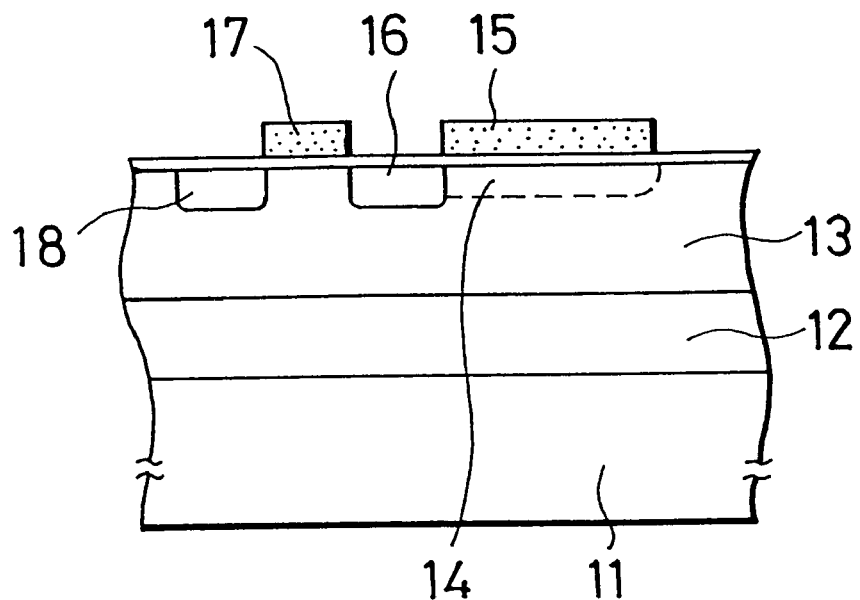
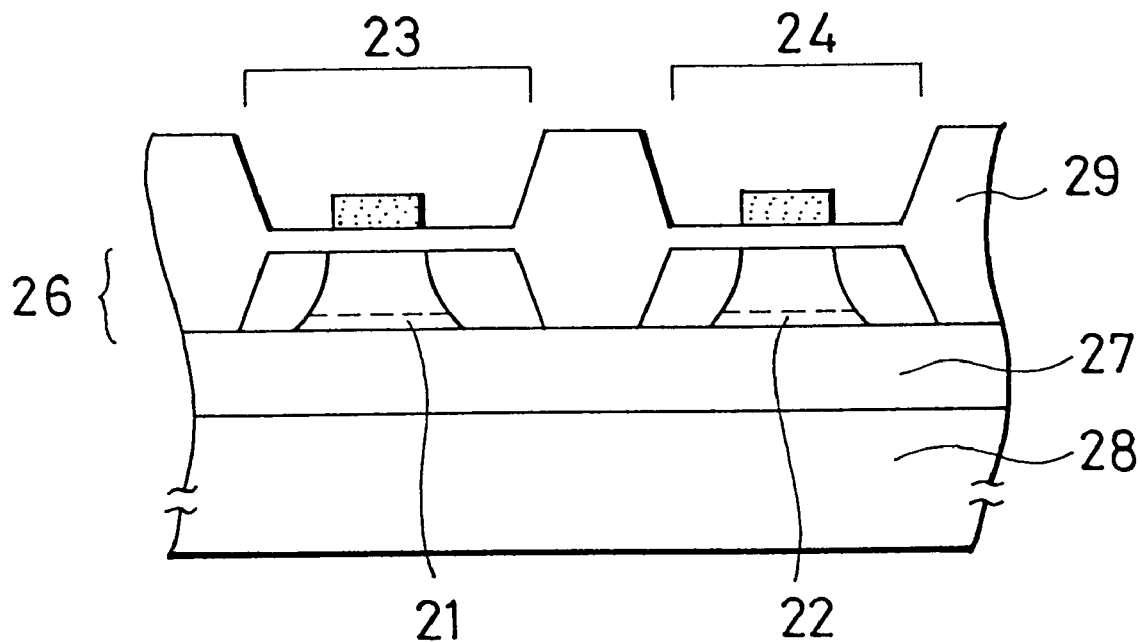

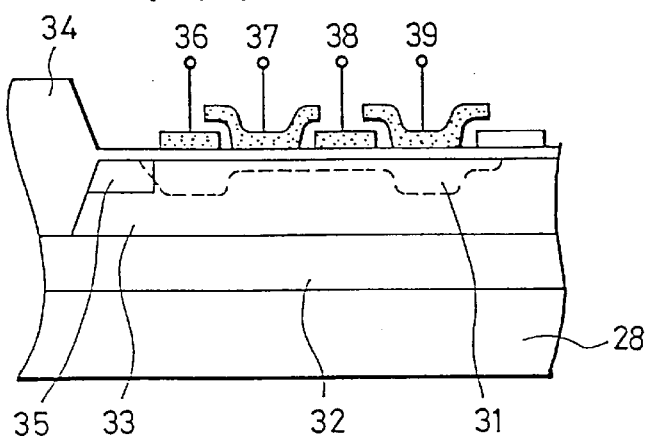
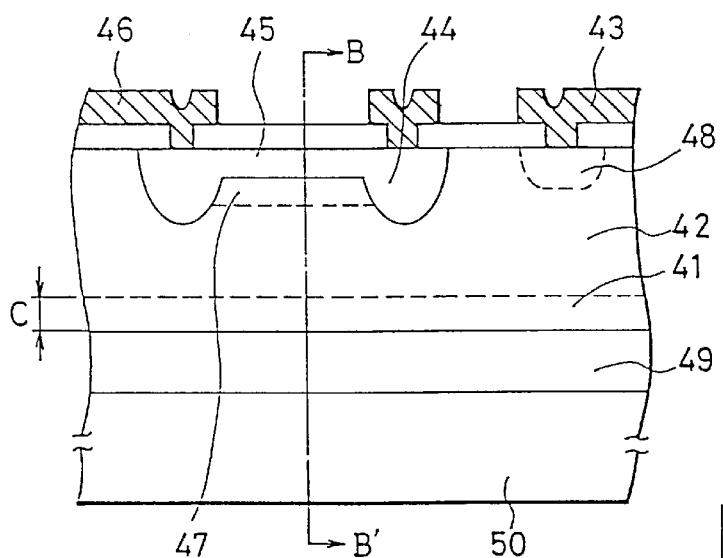
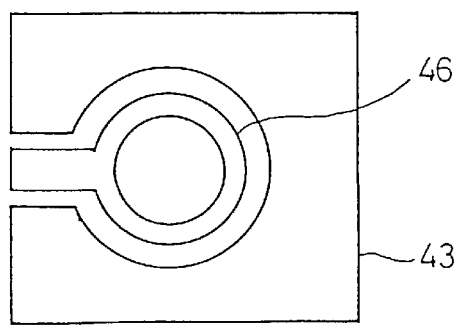

5,923,071

SEMICONDUCTOR DEVICE HAVING A SEMICONDUCTOR FILM OF LOW OXYGEN CONCENTRATION

CROSS-REFERENCE TO RELATED APPLICATIONS

This application is a continuation-in-part of application Ser. No. 08/072,551, filed on Jun. 7, 1993, and now abandoned.

BACKGROUND OF THE INVENTION

The present invention relates to a semiconductor device, especially a structure of a semiconductor substrate which composes the device substrate and in which semiconductor elements are formed, and to the separation of such elements. The present invention also relates to a semiconductor device of various kinds ranging from a logic integrated circuit device (herein called a logic IC) a memory integrated circuit device (herein called a memory IC), to a photo sensor integrated circuit device (herein called a photo sensor IC) and to an integrated circuit including a bipolar transistor and an MOS transistor (herein called an BiMOSIC).

Conventionally, a single Si semiconductor substrate is formed by crystal growth in accordance with the Czochralski method (herein called a CZ substrate) which is used for forming elements of a logic IC comprising CMOS (called a CMOSIC) and a memory IC. FIG. 24 is a cross section showing a conventional general CMOSIC formed on this CZ substrate, wherein a deep diffusion region 242 is provided on a surface of a CZ substrate 243 and wherein the substrate 243 and the diffusion region 242 each contain an N-type transistor 244 and a P-type transistor 241, respectively.

As well, for forming a memory IC such as DRAM, a part of photo sensor IC such as CCD and BiMOSIC, a semiconductor substrate (called a CZ epi substrate) having an epitaxial layer (called an epi layer) on a CZ substrate is used. This epitaxial layer is formed by epitaxial growth of Si. Therefore the decline of yield due to the defects of the semiconductor substrate can be prevented. This is because the epi layer contains only a small amount of oxygen, a cause of such defects, which are generated during heat treatment in the manufacturing process and then combined with Si.

FIG. 25 is a schematic cross section of a general DRAM cell formed on a CZ epi substrate, which shows a conventional integrated circuit device. As seen in FIG. 25, a switch transistor 255 and a condenser 256 are formed on a surface of an epitaxial layer 252. FIG. 26 is a schematic cross section of a general BiCMOSIC in which an NPN bipolar transistor 262, a CMOS device 260, and a LDMOS transistor 261 are formed on a CZ epi substrate, which shows a conventional integrated circuit device.

For forming a PIN diode and a photodiode, or a photodiode array arranging several photodiodes and a photosensor such as a photovoltaic cell represented by a solar battery, a single Si semiconductor substrate (it is herein called an FZ substrate) which is formed by crystal growth in accordance with zone melting method is occasionally used. This is because an FZ substrate has higher electric resistivity than that of a CZ substrate.

For forming a PIN diode, an avalanche photodiode (herein called an APD), and a photodiode or a photosensor IC such as a photodiode array arranging several photodiodes and BiCMOSIC, a semiconductor substrate (herein called an FZ epi substrate) having an epitaxial layer (herein called an epi layer) which is produced by epitaxial growth of Si is occasionally used. This is because an FZ substrate lowers a series resistance as well as the fact that an epi layer provides a high electric resistivity. When BiCMOSIC is formed with an FZ substrate, separation of elements is achieved.

FIG. 27 is a schematic cross section showing an APD formed on a conventional FZ epi substrate. As seen in FIG. 27, a P-type epitaxial layer 271 (called Tv layer) in which impurity concentration is under $10^{14}$ atoms/cm$^3$ is provided and furthermore, on its surface, a P$^+$-type diffusion region 277 and a N$^+$-type diffusion region 274 are provided. The substrate 272 and the N$^+$-type diffusion region 274 includes an anode electrode 276 and a cathode electrode 273 respectively.

In case of forming a photovoltaic cell and so on, if output by several elements connected in series is needed since electric power generation for one piece of PN junction is insufficient, as shown in FIG. 29, a substrate (herein called a dielectric isolation substrate) formed by the dielectric isolation method is used.

For example, as shown in FIG. 29($a$), firstly a V-groove 292 is formed on a N-type Si substrate 291 and then a SiO$_2$ film 293 which will be an isolation insulator by thermal oxidation is formed on the surface of the substrate. Next, poly Si is formed for several hundreds of $\mu$m so that a poly Si substrate 294 is made. Next, the Si substrate 291 is polished until the Si substrate is divided with the V-groove 292 so that a P$^+$-layer 295, a N$^+$-layer 296, and an electrode 297 are formed as shown in FIG. 29($b$).

A conventional semiconductor device has a semiconductor substrate of which the structure is stated above. However, there are some problems to be solved as mentioned below.

The first problem is as follows:

As shown in FIG. 24, when a CZ substrate is used, its resistivity to latch-up caused by a parasitic thyristor comprising, for example, a P-type impurity source region 245, a N-type impurity well region 242, a P-type CZ semiconductor wafer region 243, and an N-type impurity drain region 246 is low. A memory IC such as DRAM having a CMOS structure has a similar problem. As stated above, it is a common problem to all of IC that defects increase, namely, yield lowers, by educed oxygen, which is characteristic of a CZ substrate.

The educed oxygen increases the number of recombination centers in a forbidden energy region which is for recombination of electron and hole. That lowers carrier lifetime. As a result, that further causes fatal problems, for charge retention time of a memory declines in DRAM and photoelectric conversion efficiency and carrier transfer efficiency worsens in CCD.

The second problem is as follows.

As shown in FIG. 25, when a CZ epi substrate is used, if substrate resistivity of a CZ substrate 251 is, for example, a predetermined amount Ω-cm, lower than an upper epi layer 252, the problem of latch-up stated above is almost solved. However, since oxygen educes from the CZ substrate including relatively much oxygen to the epi layer in manufacturing process, though the epi layer includes little oxygen in general, increase of defects or increase of recombination centers in a forbidden energy region for recombination of an electron with a hole, both of which are caused by educed oxygen, lower carrier lifetime of an inversion layer 253, as stated above. It is not expected that radiation resistance rises remarkably. As shown in FIG. 26, the CZ substrate includes a CMOS section 260 and so has the problems stated above. Specifically, for example, in case of a LD (Lateral Diffusion) MOS section which requires higher breakdown voltage, namely, high electric resistivity, an N-type epi layer 263 cannot acquire high electric resistivity because of the CZ when it is formed on the P-type CZ substrate 251.

Owing to the decline of carrier lifetime, the NPN bipolar transistor section 262 and so on cannot achieve a good bipolar property Furthermore, BiCMOSIC has many manufacturing processes, is complicated, and costs much to produce.

The third problem is as follows:

When a FZ substrate is used, though hidden from the view, the problem caused by the educed oxygen is considerably solved. However, an FZ substrate has a problem in physical strength because oxygen concentration of such a substrate is low. Namely, a substrate is deformed (a wafer is warped) by heat treatment in manufacturing process and dislocation slip increases. Once a substrate is warped it gets hard to advance following manufacturing process. The larger a wafer size, the more a substrate becomes warped. As for latch-up and radiation resistance, the conventional substrate cannot be improved.

The fourth problem is as follows:

When an FZ epi substrate is used, warping is inevitable though latch-up is improved, which is hidden from view. FIG. 28 shows a schematic impurity concentration distribution of a semiconductor layer at the section A-A' of FIG. 27. The epitaxial layer 271 is constituted of epitaxial silicon, so it cannot have very high electric resistivity. Furthermore, the epitaxial layer 271 cannot be formed thickly. A FZ epi can have a higher electric resistivity than a CZ substrate, but several hundred Ω-cm is the limit.

A thickness of epi is a few dozen $\mu$m generally. It is at most 100 $\mu$m. In order to detect X-rays by an avalanche photodiode ("APD"), the P$^+$-type layer 272 is a scattering region of an incident ray. The length a of that region should be short. However, for example, even if a substrate having an epi layer is polished from the back in order to thin the substrate, because a P$^-$-type layer having high impurity concentration must remain in order to lower contact resistance with an anode electrode, a region b remains. Therefore the substrate cannot be thinned more than a certain extent. The region b is a diffusion region of impurity from a substrate in epitaxial growth. At the very least, the region b having a profile sloped gently occupies a few $\mu$m.

The fifth problem is as follows:

When a dielectric isolation substrate is used, it takes too long and costs too much to manufacture the dielectric isolation substrate because it has so many complex manufacturing processes as stated before. Furthermore, the wafer size cannot be large because of the manufacturing process. It follows that the dielectric isolation substrate cannot be manufactured by the latest manufacturing process.

SUMMARY OF THE INVENTION

One of the objects of the present invention is to provide a semiconductor device in which a lifetime of minority carrier is long.

Another object of the present invention is to provide a semiconductor device overcoming the problem of latch-up caused by minority carriers having a long lifetime.

Another object of the present invention is to provide a semiconductor device which solves the problem caused by an interaction between the elements located closely each other.

Another object of the present invention is to provide a semiconductor device having great mechanical strength.

Another object of the present invention is to provide a photo sensor semiconductor device having high photoelectric conversion efficiency.

Another object of the present invention is to provide a photo sensor semiconductor device responding at high speed.

Another object of the present invention is to provide a photo sensor semiconductor device having great energy resolution.

Another object of the present invention is to provide a semiconductor device which can be manufactured by simplified manufacturing process.

Another object of the present invention is to provide a semiconductor device having few defects included by, for example, radiation.

Another object of the present invention is to provide a semiconductor device which can be manufactured at a small cost.

In order to achieve the above objects, the inventive semiconductor device is constituted as follows:

Carrier flows in a monocrystal silicon film of low oxygen concentration. A backing substrate of which at least the contact section is composed of an insulting material supports the monocrystal silicon film. One or a few semiconductor elements are disposed at the monocrystal silicon film. The backing substrate is provided for supporting the monocrystal silicon film having low disruptive strength. The insulating material of the contact section not only separates electrically the backing substrate and the silicon film but also prevents the substances such as elements and molecules from transferring between the backing substrate and the silicon film. The oxygen concentration of the silicon film is set at low value in order to lengthen a lifetime of the minority carrier.

Furthermore, referring to the detail, the following means are applied.

First of all, the film thickness of the monocrystal silicon film is set below 200 $\mu$m and the oxygen concentration is set below $1\times10^{17}$ atoms/cm$^3$.

Second of all, the substrate is used which comprises the backing substrate of which at least the surface is formed by an insulating film having a smaller diffusion coefficient of oxygen than that of the monocrystal silicon and the monocrystal silicon film having the oxygen concentration below $10^{17}$ atoms/cm$^3$ and provided on the backing substrate. Furthermore, semiconductor element or semiconductor integrated circuits are provided on the monocrystal silicon film stated above.

Third, the impurity concentration of the monocrystal silicon film is set below $10^{14}$ atoms/cm$^3$ or the resistivity of the monocrystal silicon film is set over 100 Ωcm. Then semiconductor elements or semiconductor integrated circuits are provided on the monocrystal silicon film.

Fourth, a polycrystal silicon film is provided on the surface of the backing substrate so as to touch the monocrystal silicon film. Then semiconductor elements and semiconductor integrated circuits are provided on the monocrystal silicon film.

Fifth, a hole is provided at the backing substrate.

Sixth, a transparent substrate is used as the backing substrate.

Seventh, the impurity concentration of the semiconductor film touching the backing substrate is set so as to be higher-than the impurity concentration of the inside of the semiconductor film.

Last of all, the backing substrate is made of polycrystal or amorphous silicon.

BRIEF DESCRIPTION OF THE DRAWINGS

FIG. 1 is a schematic cross section showing a DRAM cell constituting a memory IC which is a semiconductor device disclosed in the first embodiment of the present invention;

FIG. 2 is a schematic cross section showing both a PMOS transistor and a NMOS transistor which constitute a CMOSIC which is a semiconductor device disclosed in the third embodiment of the present invention;

FIG. 3 is a schematic cross section of a cell unit comprising a sensing diffusion region and a charge transfer channel that constitutes CCD which is a semiconductor device disclosed in the second embodiment of the present invention;

FIG. 4(a) is a schematic cross section showing APD of a semiconductor device which is the first application disclosed in this embodiment of the present invention;

FIG. 4(b) is a plan view showing APD of a semiconductor device which is the first application disclosed in this embodiment of the present invention;

DETAILED DESCRIPTION OF THE EMBODIMENT

Figure 5:
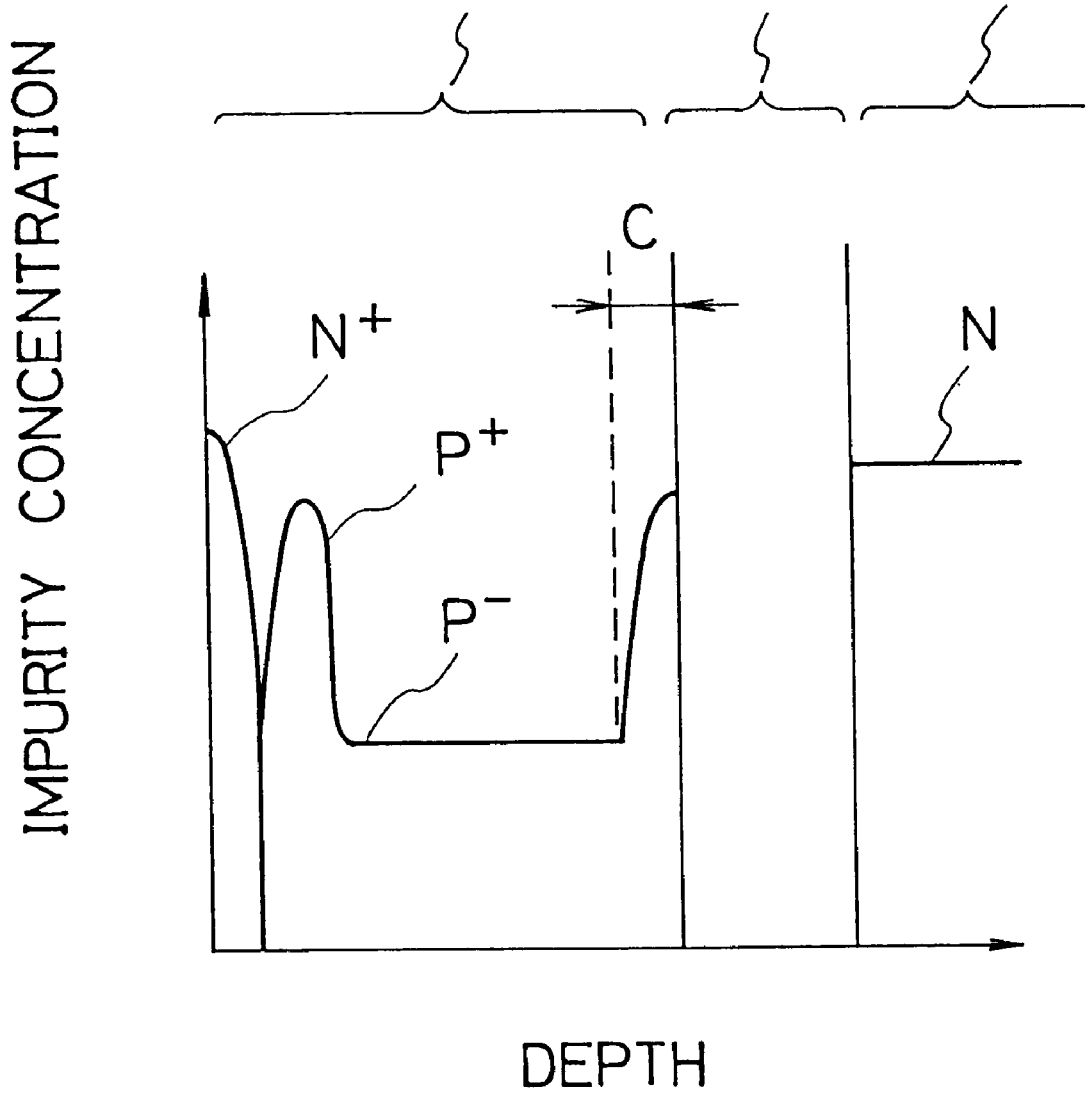
FIG. 5 is a schematic impurity concentration distribution at the section B-B' of FIG. 4(a)

Referring to the drawings, a preferred embodiment of the present invention is described below in detail.

FIG. 1 is a schematic cross section of a DRAM cell constituting a memory IC which is a semiconductor device of a first embodiment disclosed in the present invention. However, FIG. 1 is a partial schematic drawing and actually an inter-insulating layer, electrodes, wiring, and so on are formed on or above a capacitor electrode 15, a source region 16, a gate electrode 17 and a drain region 18 so that a general integrated circuit device is formed. This is common to all the drawings.

Figure 20:
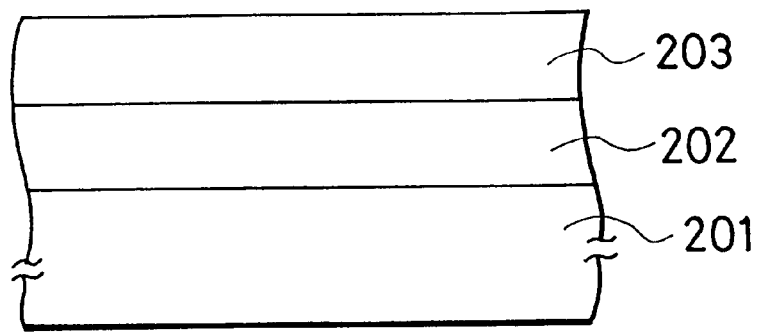
FIG. 20 is a schematic cross section showing a SOI wafer of the present invention.

FIG. 20 is an schematic cross section showing a SOI (Silicon On Insulator) wafer used for forming an integrated circuit device which is the first embodiment. The SOI wafer is formed as follows: a $SiO_2$ film 202 is formed for about 1 $\mu$m on a first semiconductor substrate 201 of several hundred $\mu$m thickness. After that, a second semiconductor substrate is pasted on the $SiO_2$ film 202 and then the second semiconductor substrate is polished so as to be several $\mu$m in thickness. Therefore, the thickness of the polished monocrystal silicon film 203 is under 100 $\mu$m. The quality of the polished monocrystal silicon film 203 is the same as the quality of the second semiconductor substrate. Generally, the lattice detect density of the bulk semiconductor substrate of the second semiconductor substrate is less than 500/cm² and the crystal azimuth in a uniform range is ±1.0 degree. Therefore, the polished monocrystal silicon film can have the same high quality. Before pasting, the $SiO_2$ film can alternatively be formed on the second semiconductor substrate, not on the first semiconductor substrate.

As a result, a DRAM element, as shown in FIG. 1 is formed on the monocrystal silicon film 203 thinned by polishing shown by FIG. 20. A backing substrate shown in FIG. 20 is the semiconductor substrate 201 of which the surface is covered with an oxide film 202. The oxide film 202, namely, an insulating film of which the diffusion coefficient of impurity such as oxygen, boron, phosphorus, and arsenic is smaller than that of silicon is formed between the semiconductor substrate 201 and the monocrystal silicon film 203. Therefore the oxygen concentration of the monocrystal silicon film 203 is set at low value. The oxygen concentration of a semiconductor film 203 has an influence on the lifetime of a minor carrier therein. A DRAM shown in FIG. 1 is a memory cell operable to store the minor carrier in a depletion layer. In order to lengthen the memory time of the memory cell, carrier lifetime is required to be lengthened. Consequently, the monocrystal silicon film 203 of which the oxygen concentration is under $10^{17}$ atoms/cm³ is easily obtained if an epitaxial substrate or an FZ substrate is used as the second semiconductor substrate in the SOI wafer. This low value, $10^{17}$ atoms/cm³, cannot be obtained in an usual silicon substrate grown by epitaxial growth.

The wafer size of the first semiconductor substrate and that of the second semiconductor as bases are usually the same. However, two wafers having different wafer sizes from each other, for example the first semiconductor substrate of 6 inches diameter and the second semiconductor substrate of 4 inches diameter, can be combined depending on the situation. This is because the semiconductor substrate having high electric resistivity adequate for APD described later is not enlarged in accordance with the wafer size as compared with the substrate.

The DRAM cell is formed in manufacturing method of a general integrated circuit using a SOI wafer having a monocrystal silicon film 13 of low-oxygen concentration. Namely, the monocrystal silicon film 13 keeps the good characteristics which the second semiconductor substrate has before polishing even after going through the manufacturing process, because the monocrystal silicon film 13 is separated completely from a base-semiconductor substrate 11 by an insulating film 12 having a small diffusion coefficient of impurity. Therefore, the increase of defects caused by educed oxygen is avoided and a good yield can be obtained. Furthermore, the decline of carrier lifetime which is caused by the increase of recombination centers to combine electrons and holes which are brought about by the educed oxygen in a forbidden energy region is avoided and so a recombination current in an inversion layer 14 under a capacitor electrode 15 decreases, a charge retention characteristic improves, and refreshing time also improves.

As well, the defects caused by radiation in a semiconductor base-substrate cannot transfer from the substrate to the monocrystal silicon film 13, because the monocrystal silicon film 13 is completely separated from the semiconductor base-substrate by the oxide film made of a material other than that of the film and the substrate. Consequently, radiation resistivity improves remarkably. Furthermore, the problem of physical strength which a single wafer of low oxygen concentration has, such as a warp, does not occur to a monocrystal silicon substrate even after going through the heat treatment in the manufacturing process of the integrated circuit device. That means that the semiconductor device having high disruptive strength as a whole is obtained by forming a film having low disruptive strength on the back substrate having high disruptive strength. When the monocrystal silicon substrate is used for the backing substrate, its impurity concentration should be more than $5 \times 10^{17}$ atoms/cm³ in order to have high disruptive strength. As for impurities, oxygen, nitrogen, and so on silicon are common. If a polycrystal or an amorphous silicon substrate is used instead of the monocrystal silicon substrate, the disruptive strength improves and the costs reduce.

If this embodiment is applied to nonvolatile memory IC such as EEPROM, CMOSIC, photosensor IC, and BiCMOSIC, the same effects as stated above can be obtained. Especially, in forming the BiCMOSIC, high electric resistivity is obtained where high reverse break down voltage is needed in the BiCMOSIC and the carrier lifetime is lengthened at bipolar elements. In forming CCD, this embodiment is tremendously effective to reduce the defects and to prevent the decline of the carrier lifetime. In forming the photosensor IC, such as the CCD, photodiode array, photosensor cell, the light already passed through a detecting region can be utilized as it is reflected by an interface of $SiO_2$ film as the base and the semiconductor base-substrate, therefore, the sensitivity and the efficiency greatly improve.

FIG. 3 is a schematic cross section showing a cell unit comprising a sensing diffusion region and a charge transfer channel and constituting CCD, a semiconductor device disclosed in the second embodiment of the present invention. The CCD is formed using an SOI wafer having a P-type monocrystal silicon film 33 of low oxygen concentration by a manufacturing process of a general integrated circuit device. At that time, a LOCOS oxide film 34 for separating elements which is adjacent from a sensing diffusion region N-type layer 35 is formed so that its lower part reaches a $SiO_2$ film 32. Electric potential wells 31 are formed in order under electrodes 36–39 and then transferred. Consequently, this embodiment solves the problems in educed oxygen, radiation resistance, and physical strength as the first embodiment does. Besides, since unit cells are electrically and completely separated each other, it can be completely prevented that unnecessary carriers get into adjacent cells. Therefore a characteristic form separating elements improves greatly. The carrier lifetime in improved when a monocrystal silicon film having low oxygen concentration is used. As a result, the CCD having high transfer efficiency is obtained.

As for separating methods, a LOCOS oxide film which is an orthodox method or trench isolation which has become common recently or etching of the monocrystal semiconductor film so that the film is islanded or a dicing cutter depending on IC and so on are applicable The effect by this separating is common to all photosensor IC such as photodiode array and every image sensor. Latch-up can be completely eliminated from all CMOSIC as elements are completely separated from each other. An on-chip high voltage generation circuit of EEPROM can acquire a high performance. The manufacturing process of BiCMOSIC is greatly simplified because it is unnecessary to use epi process many times. Usually, if a bulk substrate having low oxygen concentration is used, the lifetime of a minor carrier improves and latch-up occurs frequently. However, in this embodiment, elements are accumulated in the SOI substrate and so latch-up resistance does not decline though the minority carrier lifetime is lengthened.

Figure 7:
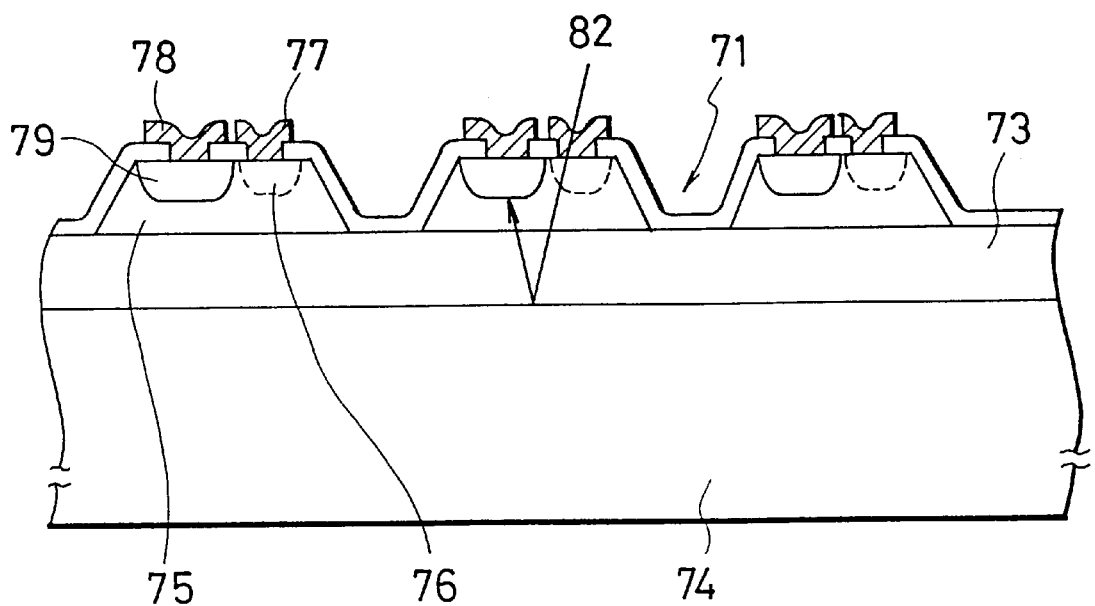
FIG. 7 is a schematic cross section showing a plurality of cell units constituting a photodiode array of a semiconductor device which is another application disclosed in the second embodiment of the present invention.

FIG. 7 is a schematic cross section showing several unit cells constituting a photodiode array which is a semiconductor device of other application disclosed in the second embodiment of the present invention.

In FIG. 7, 71 is a Si island isolation region, 73 is a silicon oxide film, 74 is a semiconductor base-substrate, 75 is an N$^-$-type monocrystal silicon film of low oxygen concentration, 76 is an N$^+$-type layer, 77 is a cathode electrode, 78 is an anode electrode, and 79 is a P-type layer. The Si island isolation region formed by Si etching separates elements in this structure. As stated above, since carriers are thereby prevented from diffusing into other cells, the photodiode array acquires very high performance as a photosensor. What every PN junction in this array is connected in series is a photovoltaic cell represented by a photovoltaic cell array used for solid state relay and a solar battery. However, by applying the present invention, a dielectric isolation substrate is no longer necessary, a great deal of processing time is saved, and the costs are substantially cut down. At the same time, it is possible to raise a voltage and improve efficiency.

FIG. 2 is a schematic cross section showing both a PMOS transistor and an NMOS transistor constituting a CMOSIC formed on a backing substrate 28 which is a semiconductor integrated circuit device disclosed in a third embodiment of the present invention. An N$^+$-type layer 21 which is a shallow impurity layer and a P$^-$-type layer 22 which is also a shallow impurity layer are provided under a PMOS transistor 23 and a NMOS transistor 24 respectively. Both are provided underneath a monocrystal silicon film 26 having low oxygen concentration so as to contact a SiO$_2$ film 27 as a base. To form the impurity layers at an interface of the base can be done before attaching the backing substrate or while elements are formed in a manufacturing process by means of ion injection. BF$_2$ of 1E14 atoms/cm$^2$–7E14 atoms/cm$^2$ and the same quantity as BF$_2$, which are examples, should be injected to form the P$^-$-type layer and the N$^+$-type layer respectively. They have smaller diffusion coefficient than those of boron and phosphorus.

The above structure brings the following effects. Not only are the effects stated in the first and the second embodiment gained but also, the well-known backchannel characteristic of a SOI transistor is prevented as the interface between the monocrystal silicon film having low oxygen concentration and the base-SiO$^2$ gets stable. Generally, in case of the CMOSIC formed on a bulk silicon substrate, when the oxygen concentration of the substrate lowers latch-up resistance also lowers. However, by providing the structure disclosed in the present invention, the oxygen concentration of the silicon film can be set regardless of latch-up resistance.

FIG. 4($a$) is a schematic cross section showing an APD (Avalanche Photo Diode) which is a semiconductor integrated circuit device of a first application disclosed in the third embodiment of the present invention. In FIG. 4($a$), 47 is a P$^+$-type layer, 46 is a cathode electrode, 45 is a N$^+$-type layer, 43 is an anode electrode,—48 is a P+-type layer, 42 is a P$^-$-type layer ($\pi$ layer) monocrystal silicon film having low oxygen concentration and high resistance, 41 is a P$^+$-type layer, 49 is a silicon oxide film, 50 is a semiconductor base-substrate. FIG. 4($b$) is a schematic plan view showing the anode electrode 43 and the cathode electrode 46 shown in FIG. 4($a$).

FIG. 5 is an impurity concentration distribution of a semiconductor region at a section B-B' shown in FIG. 4($a$). When an SOI substrate is used, resistivity of the P$^-$-type ($\pi$ layer) 42 can be set at a high electric resistivity. This is because a single substrate can be manufactured to be a wafer having high electric resistivity. The highest resistivity which a substrate having an epitaxial layer can achieve is at most several hundred Ω-cm.). So, the desired resistivity is easily obtained. The thickness is easily controlled from a few $\mu$m to several hundred $\mu$m. Therefore, it is possible to design dimensions such as the thickness of the $\pi$ layer 42 having necessary response speed and detecting efficiency, according to an energy region and a wavelength region to detect the light, x-ray, and radiation.

For instance, in order to get the time resolution under a few tenths of a nanosecond (a half-width of the peak on the time spectrum) and further in order that the spectrum waveform approximates the Gaussian pulse without having skirts, P+-type layer must be under 1 $\mu$m. For instance, in order to detect x-ray of 15 keV by the efficiency of 40%, the $\pi$ layer 42 must be about 200 $\mu$m. In case of the $\pi$ layer of 50 $\mu$m, the efficiency is 11%. In case of 20 keV, 18% is of 200 $\mu$m and 5% is of 50 $\mu$m. It is useful to thicken the $\pi$ layer. But the thicker the $\pi$ layer is, the wider the skirts of the spectrum waveform is. Therefore, the dimensions are determined by some preferable characteristics required for the semiconductor device.

Furthermore, as shown in FIG. 4($a$), the shallow P+type layer 41 is provided so as to satisfy necessary constitution as the APD. Since there is no process of heat treatment like an epitaxial process, the P$^+$-type layer 41 doesn't diffuse so much to the $\pi$ layer 42 and so a scattering region C can be much miniaturized.

BF$_2$ of 1E14 atoms/cm$^2$–7E14 atoms/cm$^2$ should be injected to the P$^+$-type layer 41 by ion implantation. This is because a surface concentration for permitting a necessary ohmic contact with the anode electrode becomes more than 1E18 atoms/cm$^3$ despite the fact that the diffusion coefficient is smaller than boron. Specifically, the n layer 42 has a long carrier lifetime because its oxygen concentration is under $10^{17}$ atoms/cm$^3$. As a result, a highly efficient APD is achieved.

Figure 6:
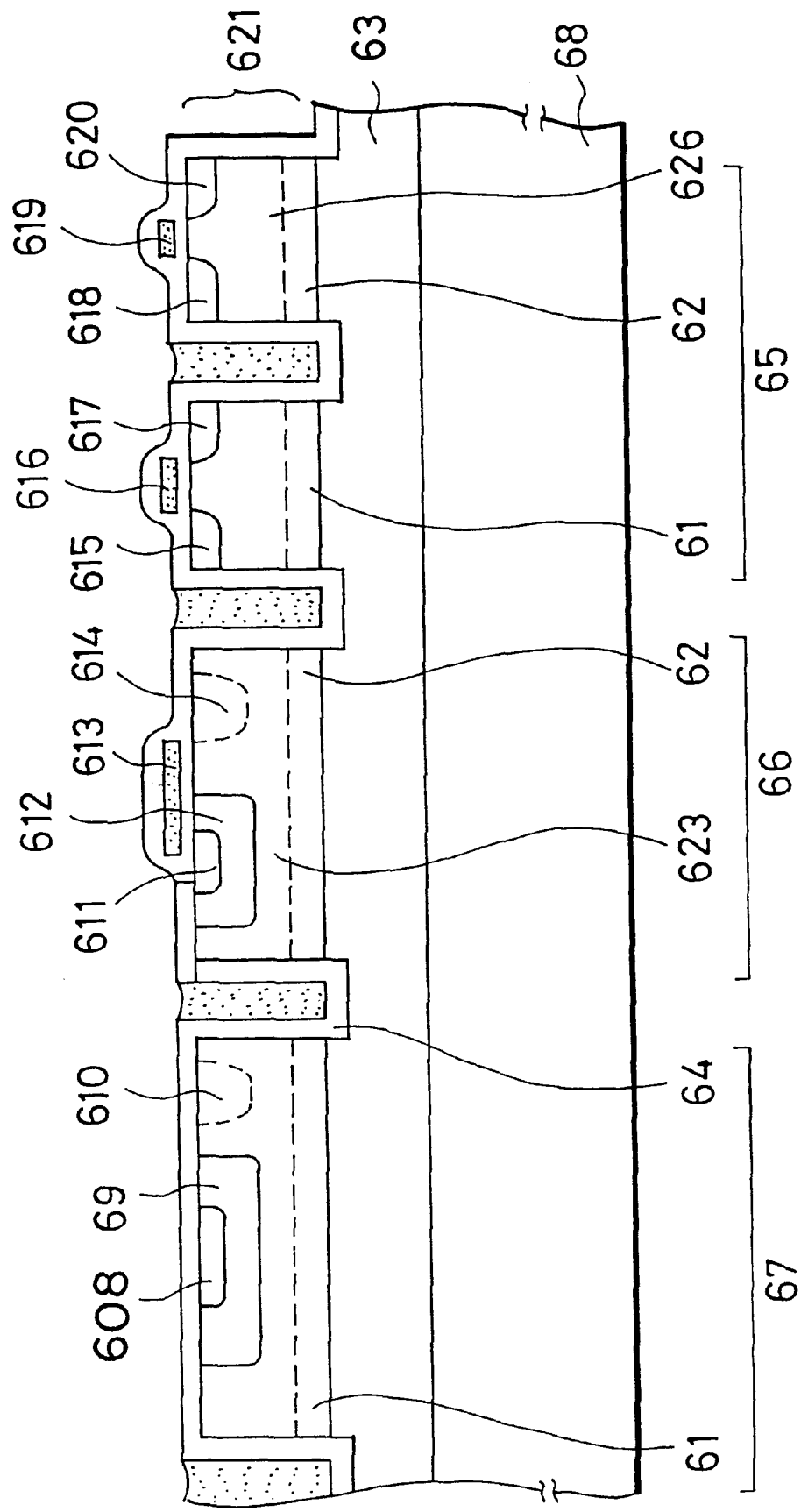
FIG. 6 is a schematic cross section showing a BiCMOSIC of a semiconductor device which is the second application disclosed in this embodiment of the present invention.

FIG. 6 is a schematic cross section showing BiCMOSIC which is a semiconductor integrated circuit device of a second application disclosed in the third embodiment of the present invention. As shown in FIG. 6, a monocrystal silicon film 621 having low oxygen concentration is provided on a backing substrate 68 through an oxide film 63 and further, an NPN bipolar transistor 67, LDMOS 66 and CMOS 65 are formed on a surface of the monocrystal silicon film 621. 608 is an N-type emitter, 69 is a P-type base, and 610 is a N-type collector, which elements constitute the NPN bipolar transistor 67. 611 is a P$^+$-type source, 612 is a N-type sub, 613 is a gate electrode, 614 is a P-type drain, and 623 is a P-type well diffusion layer, which elements constitute the LDMOS 66. 615 is a P-type drain, 616 is a gate electrode, 617 is a P-type source, 618 is a N-type drain, 619 is a gate electrode, 620 is a N-type source, and 626 is a P-type well diffusion layer, which constitute the CMOS 65. An N$^+$type region 61 or a P$^+$-type region 62 is provided under the silicon film 621 of each semiconductor element stated above.

Figure 26:
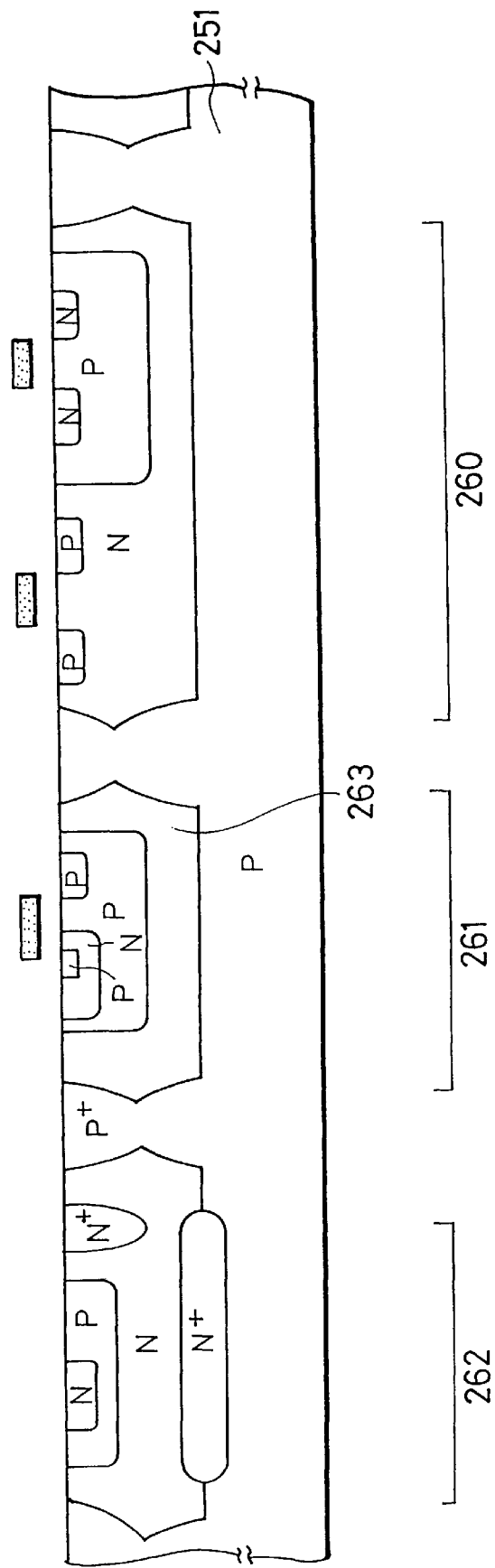
FIG. 26 is a schematic cross section showing a general BiCMOSIC formed on a CZ epi substrate which is a conventional integrated circuit device.
Figure 27:
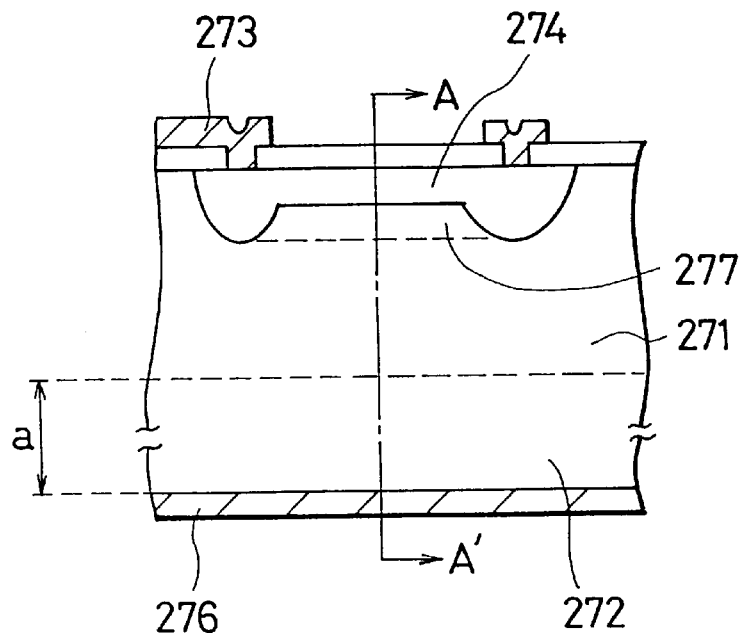
FIG. 27 is a schematic cross section showing APD formed on a FZ epi substrate which is a conventional integrated circuit device.
Figure 28:
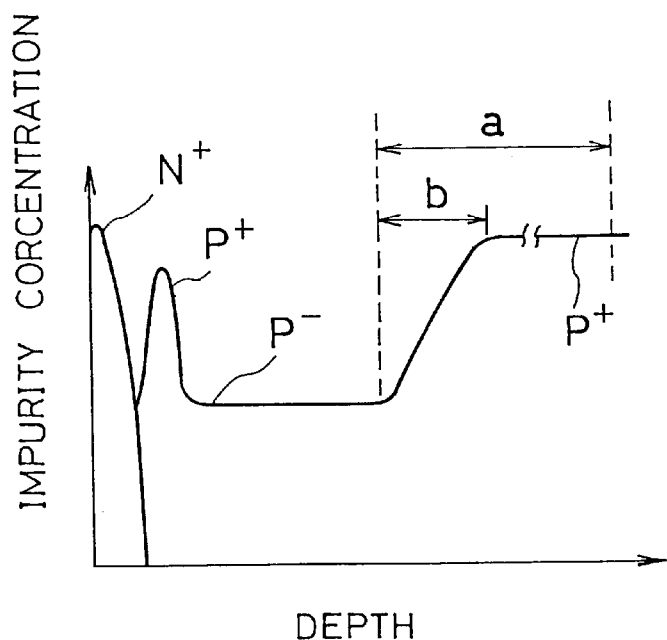
FIG. 28 is a schematic impurity concentration distribution at a section A-A' of FIG. 27.
Figure 29A:
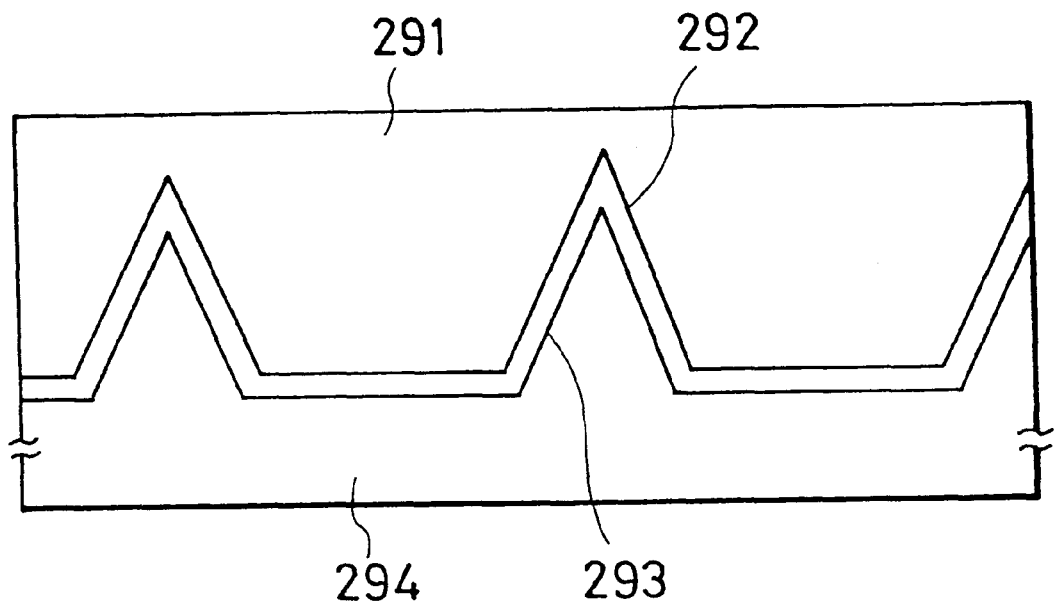
FIGS. 29(a) and (b) are schematic cross sections showing manufacturing process of a photovoltaic cell formed on a dielectric isolation substrate which is a conventional integrated circuit device.
Figure 29B:
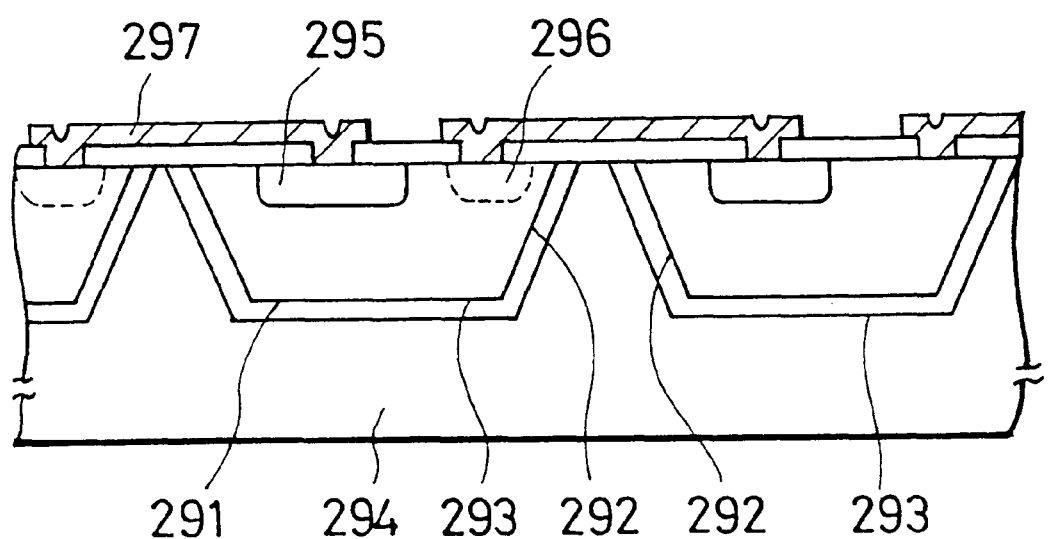

Using the SOI substrate in addition to forming both a trench ditch isolation 64 as the isolation method so as to reach the base substrate, the SiO$_2$ 63 and the N$^+$-type layer 61 and the P$^+$-type layer 62 so as to touch a base-interface realize the following excellent characteristics. Firstly, a latch-up free CMOS device 65 can be produced and backchannel can be prevented. Secondly, high electric resistivity can be obtained at the LDMOS 66, an element having a high breakdown voltage. Third, good carrier lifetime can be obtained at the NPN bipolar transistor 67. Besides having excellent electrical characteristics, the manufacturing process of the device can be greatly simplified by eliminating a complicated epi process and a complicated buried diffusion process, as stated above. Specific comparison of the number of the processes is not stated herein as it is not the main point, however, it is easily found if compared with the prior art mentioned above including FIG. 26. Elements having various functions can be easily formed on a film of a substrate because of a SOI substrate of a monocrystal silicon film having low oxygen concentration.

Figure 8:
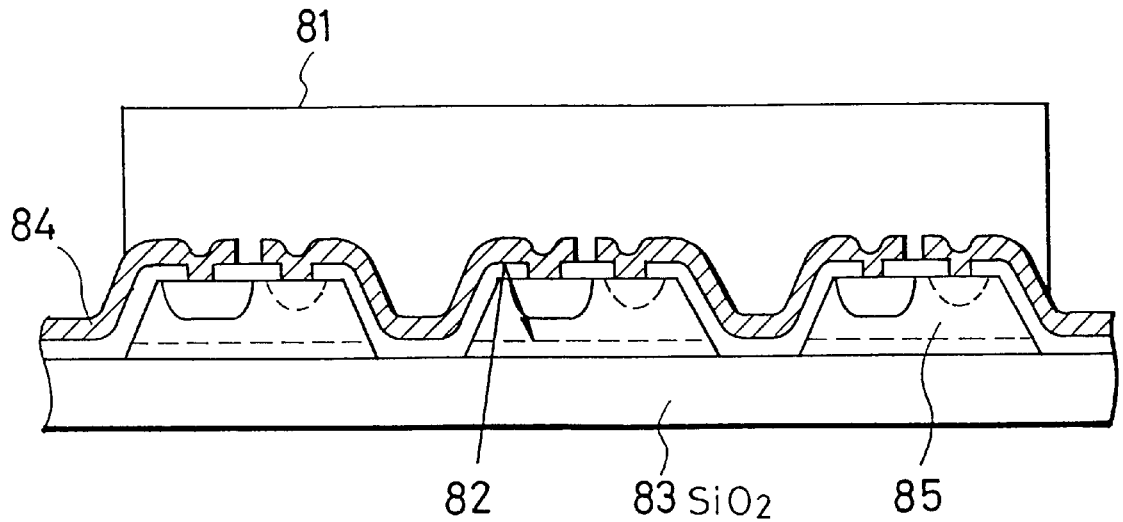
FIG. 8 is a schematic cross section showing a photovoltaic cell which is a semiconductor device disclosed in the fourth embodiment of the present invention.
Figure 9A:
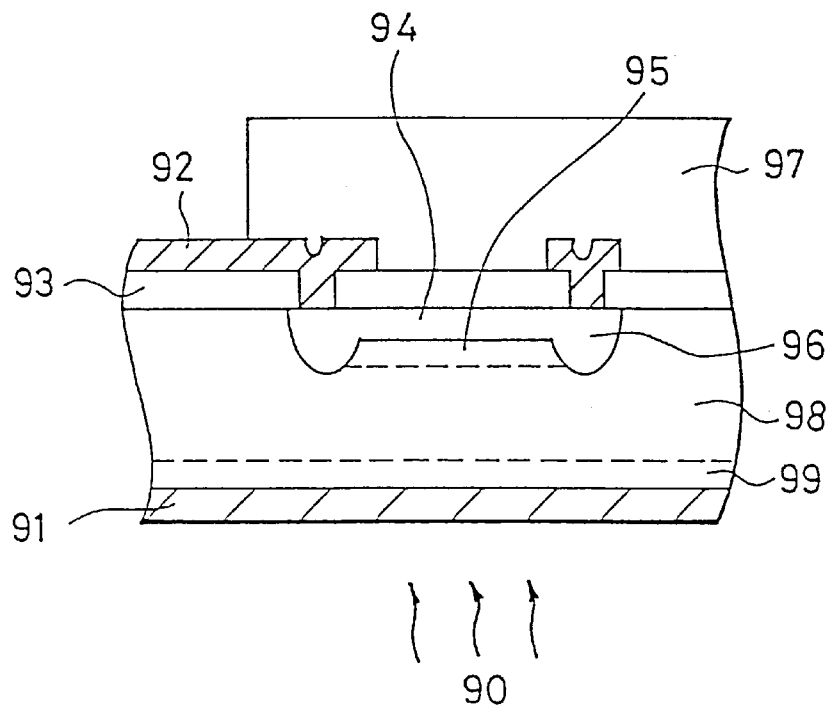
FIGS. 9(a)–9(d) are schematic cross sections showing APD which is a semiconductor device of the first to the fourth applications, respectively, disclosed in this embodiment of the present invention.
Figure 9B:
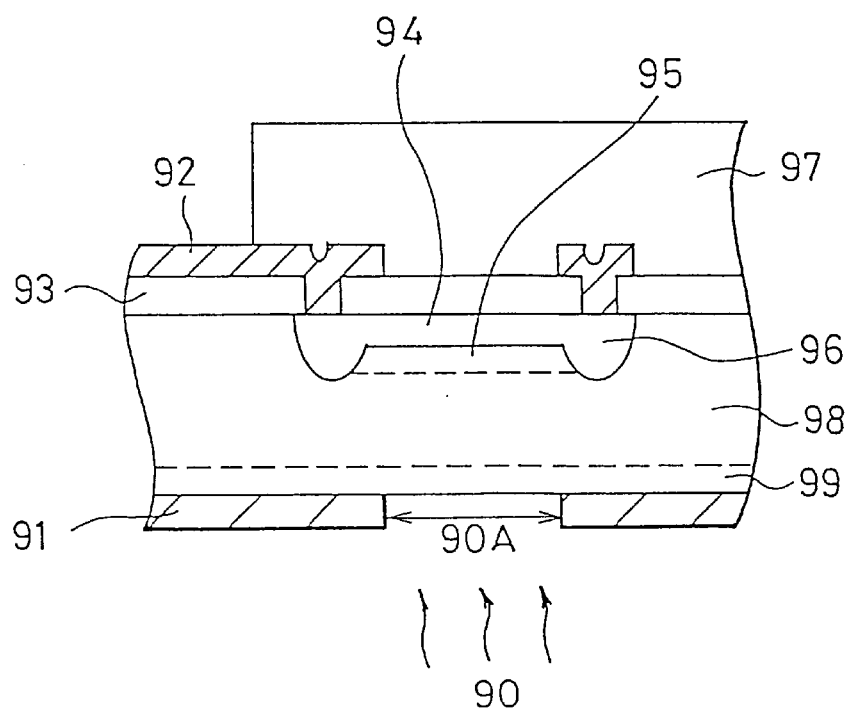
Figure 9C:
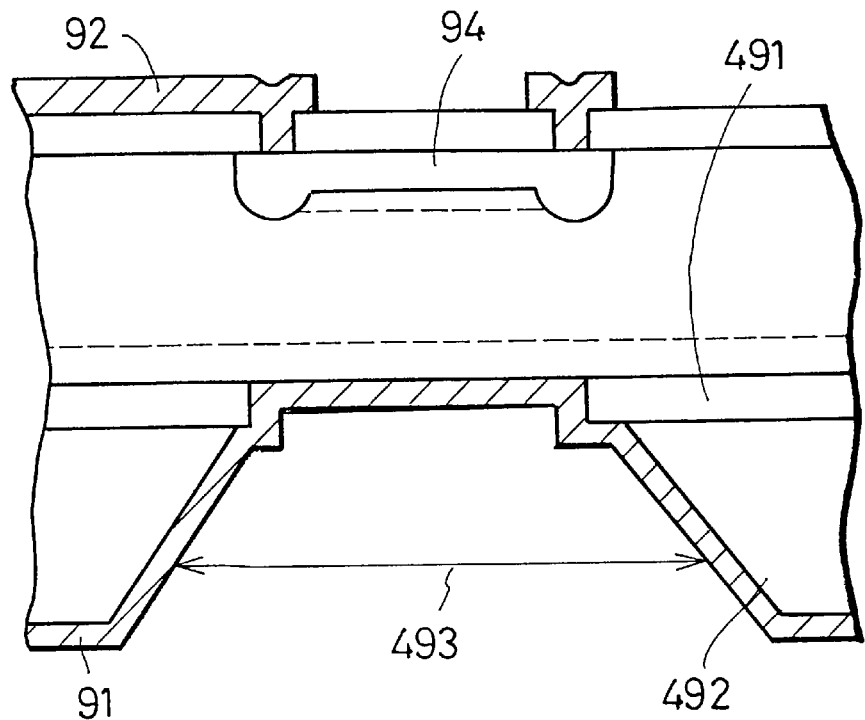
Figure 9D:
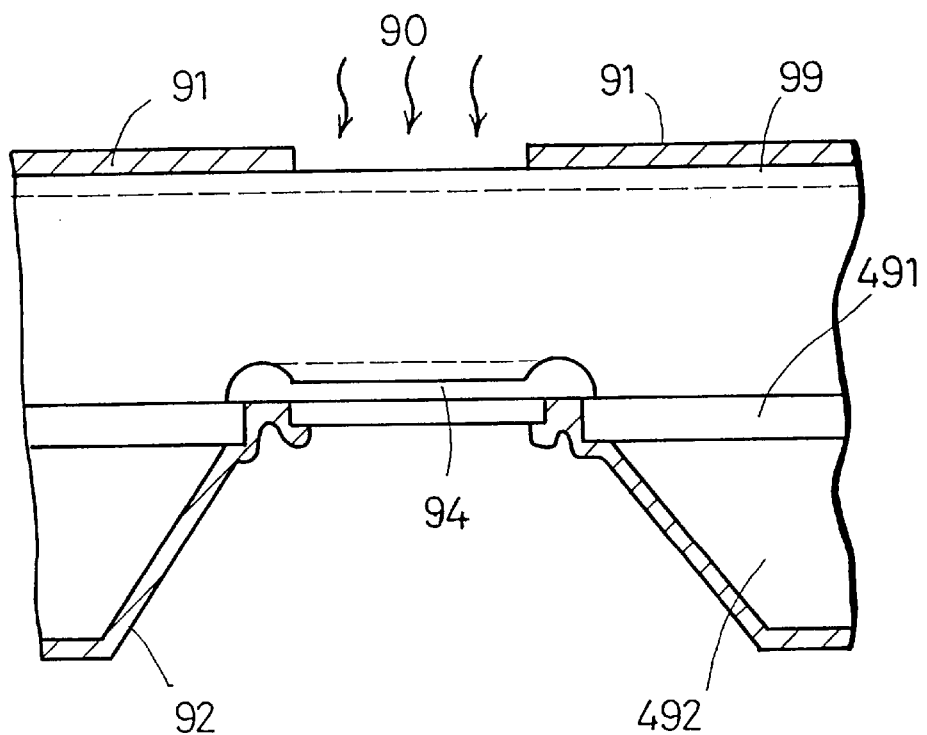

FIG. 8 is a schematic cross section showing a photovoltaic cell which is a semiconductor integrated circuit device disclosed in a fourth embodiment circuit device disclosed in a fourth embodiment of the present invention. As explained in the first—the third embodiments, in the latter part of the manufacturing processes of the photovoltaic cell made by the present invention, a reinforced substrate 81 such a Pyrex glass plate, a quartz plate, a metal plate, and a plate of a resin is added above a monocrystal silicon film and then a semiconductor base-substrate is removed by etching or grinding or polishing with using an $SiO_2$ film 83 as a stopper. A backside can be irradiated by an incident light 82 and so the light is not reduced by an electrode 84. As a result, it is possible to irradiate with higher efficiency. Therefore, in the embodiment shown in FIG. 8, a backing substrate to get a mechanical destructive strength of the semiconductor device is the reinforced substrate 81 provided on a semiconductor film 85 through an adhesive. The reinforced substrate 81 is generally made of glass. The reinforced substrate 81 can be provided after forming a semiconductor element in the embodiment shown in FIG. 8. Therefore the reinforced substrate can be made of a material of which the melting point is under 1000° C.

Furthermore, by enlarging the area of the electrode 84 or making the electrode 84 with a material having high reflectance, it is possible to utilize the return of the incident light which has passed through the monocrystal silicon film 85 of low oxygen concentration on which a detecting element is formed. Therefore it is possible to irradiate with higher efficiency. Of course, finally, a substrate can be installed to the backside for protection only when the substrate is transparent toward the incident light. This embodiment can be more useful if combined with the first, the second, the third, and the fifth, a state later, embodiments.

FIG. 9(*a*) is a schematic cross section showing an APD which is a semiconductor integrated circuit device of a first application disclosed in the fourth embodiment of the present invention. In FIG. 9, 92 is a cathode electrode, 93 is an insulating film, 94 is a $N^+$-type layer, 95 is a $P^+$-type layer, 96 is a N-type layer, 97 is a reinforced substrate, 98 is a π layer, 99 is a $P^+$-type layer, and 91 is an anode electrode.

As explained above, in the APD made by the present invention, the semiconductor base-substrate is removed, then the $SiO_2$ film is also removed, and then the anode electrode is provided. By providing the above-mentioned structure and receiving the incident light such as an x-ray 90 to be detected from the backside, it is possible to detect an x-ray having very low energy under a certain value such as 10 keV with a little loss not being blocked out by the $N^+$-type layer 94 which is an anti-sensing region, the insulating film 93, and the cathode electrode 92. Further, though hidden from the view, to provide an anode electrode 43 shown in FIG. 4(*a*) on the identical surface of the cathode electrode 92 shown in FIG. 9(*a*) enables the APD to detect the incident light with very little loss.

As well, as shown in FIG. 9(*b*) to provide a window at the anode electrode 91 (a window 90A) enables the APD to detect the incident light with little loss as mentioned above. The present invention disclosed all the techniques, however, a limit of the improvement of detecting efficiency is decided in consideration for necessary performances, increase of the manufacturing process, and requirements of the assembling method. This example of an application can be used combining with other photosensor IC such as CCD and photodiode array.

FIG. 9(*c*) is a schematic cross section showing an APD which is a semiconductor integrated circuit device of a second application disclosed in the fourth embodiment of the present invention. In this application, in order to remove a semiconductor base-substrate 492 by etching, only a detecting portion which is a window 493 shown in FIG. 9(*c*) is removed by an anisotropic etching such as with KOH using an oxide film 491 as an etching stopper, as explained in the first application. Since the semiconductor base substrate 492 which has not been removed keeps enough mechanical destructive strength as a backing substrate, it is not necessary to add a reinforced substrate as is added in the first application. The above-mentioned APD includes minimum materials which do not function electrically at the both sides, the cathode electrode 92 and the anode electrode 91. Therefore it is possible to improve detecting efficiency more if a lot of APD are stacked and then used for detecting. Although hidden from the view, to provide the anode electrode on the surface of the cathode electrode as shown in FIG. 4(*a*) and to provide the window at the anode electrode as shown in FIG. 9(*b*) in this application are both useful. The semiconductor substrate 492 which is the backing substrate portion of FIG. 9(*c*) is not an incident region of an incident light such as an x-ray to be detected, however, it can be a scattering region where an incident ray coming into the backing substrate portion is scattered. Furthermore, though hidden from the view, when the semiconductor substrate 492 in a SOI substrate is made of a quartz substrate in this application, which means that the semiconductor substrate 492 is quartz, the semiconductor substrate 492 never functions as the scattering region.

FIG. 9(*d*) is a schematic cross section showing an APD which is a semiconductor integrated circuit device of a third application disclosed in the fourth embodiment of the present invention. In addition to providing the above-mentioned structures, the $N^+$-type layer 91 as an cathode is replaced with the $P^+$-type layer 92 as an anode in order to turn upside down. Therefore it is possible to detect even the incident ray 90 having low energy or short projection range getting closer to a light source. As a result, higher accuracy and higher efficiency can be achieved.

Figure 11:
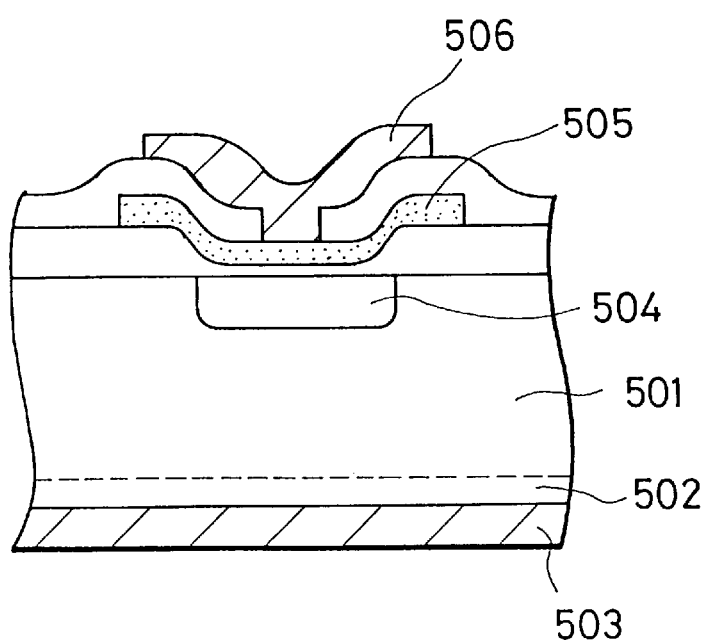
FIG. 11 is a schematic cross section showing a semiconductor image sensor device which is a semiconductor device disclosed in the second application of the fourth embodiment of the present invention.

FIG. 11 is a schematic cross section showing a semiconductor image sensor device which is a semiconductor integrated circuit device of a second application disclosed in the fourth embodiment of the present invention. This is the semiconductor image sensor device wherein each photosensor element is formed so as to be of the PIN structure and outputs signals by capacitance coupling and wherein two-dimensional detection and real time detection are possible. A $P^+$-type diffusion region 504 is provided on the surface of a monocrystal film 501 and further a $N^+$-type diffusion region 502 is provided at the back of the monocrystal film 501, which forms PIN structure. Furthermore, a gate electrode 505 is provided on the $P^+$-type diffusion region 504, so that a condenser is formed. 503 and 506 are electrodes.

Figure 12:
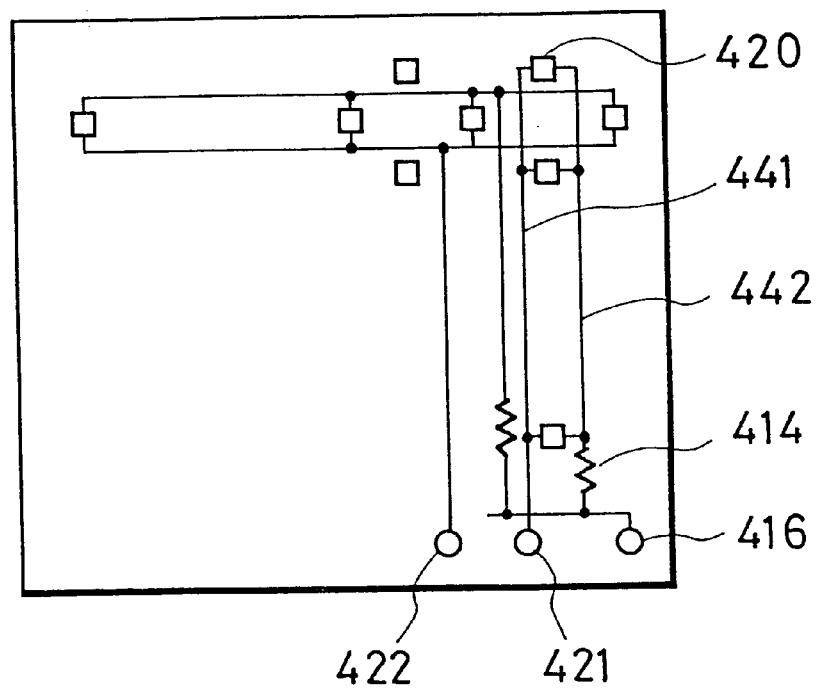
FIG. 12 is a schematic plan view showing an arrangement of photosensor elements which is an embodiment of a semiconductor image sensor device.
Figure 13:
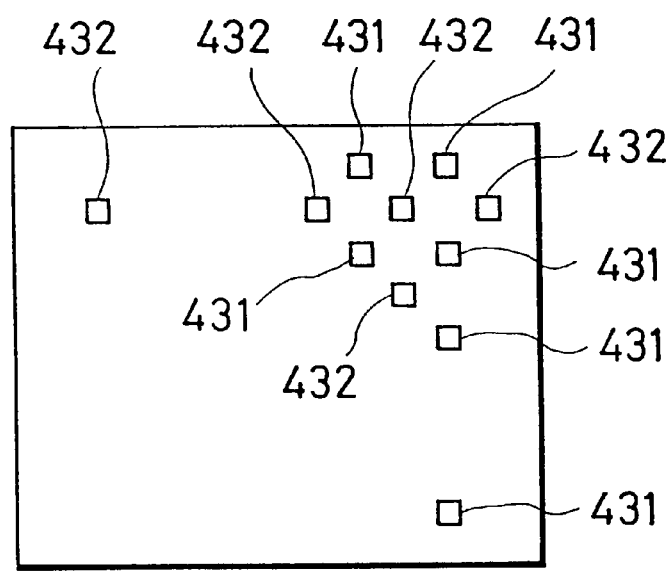
FIG. 13 is a schematic plan view showing an arrangement of photosensor elements which is an embodiment of a semiconductor image sensor device.

FIG. 12 and FIG. 13 are schematic plan views showing an arrangement of the photosensor elements in this embodiment. As seen from the view, the photosensor elements (They are called pixels below.) are arranged on the identical surface of the semiconductor. The pixels are divided into X-pixels 431 which should be read as information of an X-coordinate and Y-pixels 432 which should be read as information of a Y-coordinate. The X-pixels and the Y-pixels are arranged alternately. As seen from the view, information from the pixels (sensor output from the pixels) are gained from an X-output terminal 421 and a Y-output terminal 422 through a signal line 441 connected to each of pixels 420. Voltage of the pixels 420 is applied from an anode 416 through a bias line 442 and a bias-resistance RB 414.

Figure 14:
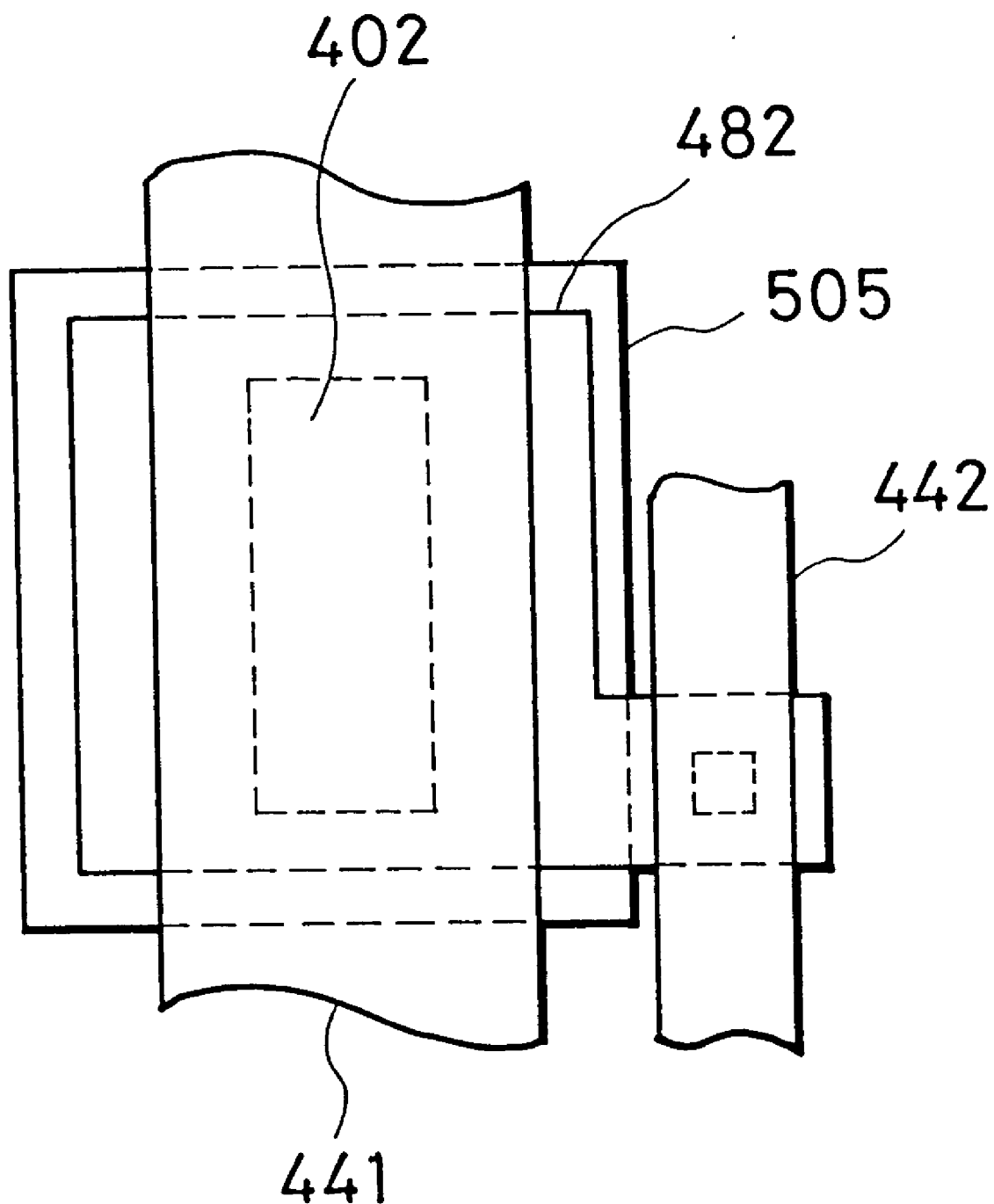
FIG. 14 is a schematic plan view showing an embodiment of a pixel of a semiconductor image sensor device.

FIG. 14 is a schematic cross section of this application comprising the signal line 441, the bias line 442, the gate electrode 505, a contact hole 402 on the gate electrode, and a $P^+$-type diffusion region 482.

Figure 15:
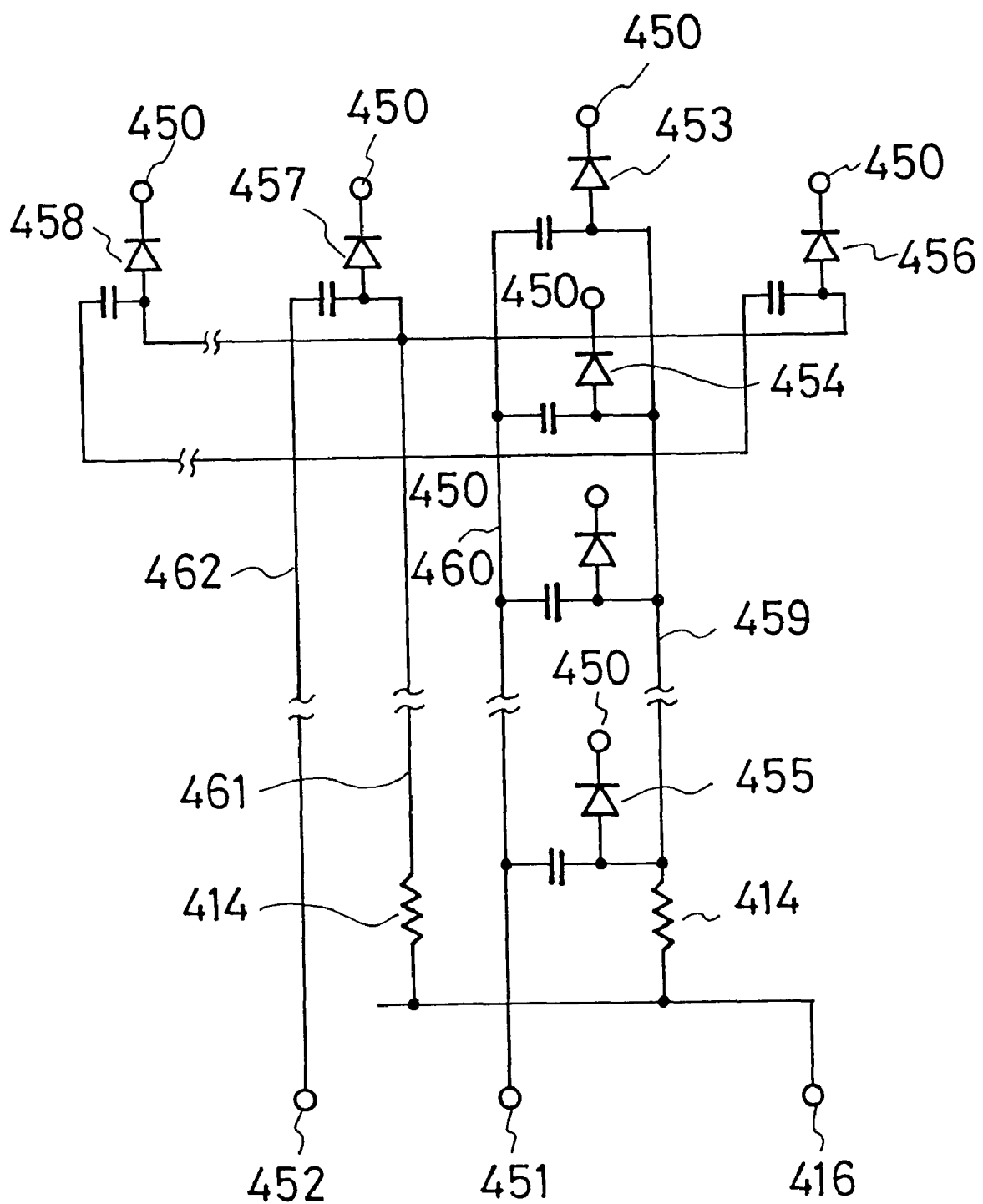
FIG. 15 is a schematic block diagram showing circuits which is an embodiment of a semiconductor image sensor device.

FIG. 15 is a schematic block diagram of this application. Outputs from an $X_1$-pixel (1, 1) 453, an $X_1$-pixel (1, 2) 454, and an $X_1$-pixel (1, n) 455, which are arraigned at the direction of Y-axis, are connected to an $X_1$-output terminal 451 through an $X_1$-signal line 460. Bias line, which adds bias voltage to each of the above $X_1$-pixels, is connected to the anode 416 through an Xi bias line 459 and the resistance 414. As for $Y_1$-pixels arranged at the direction of X-axis, the configuration is similar to that are the $X_1$-pixels. Namely, outputs from the $Y_1$-pixels 456, 457, and 458 are connected to a $Y_1$-output terminal 452 through a $Y_1$-signal line 462. Bias voltage is added from the anode 461 through a bias line 461. 450 is a diode terminal common to both the $X_1$-pixels and the $Y_1$-pixels.

A lot of pixels are two dimensionally arranged as stated above, so that two dimensional information can be obtained.

Now, suppose that the $X_1$-bias line 459, the $X_1$-signal line 460, the vertical $Y_1$-bias line 461, and the vertical $Y_1$-signal line 462 are a first layer-metal wiring and that a horizontal $Y_1$-bias line 464 and a horizontal signal line 463 are a second metal wiring. Then all the terminals such as an X output, a Y output, and an anode can be provided so as to line.

Describing characteristics necessary for the inventive semiconductor image sensor device getting the two dimensional information, in FIG. 15, the monocrystal silicon film 501 of low oxygen concentration must have a thickness between 200–300 µm and about 4–8 kΩcm in resistivity because of a relation between sensitivity and amount of substance. The film is useless if it is thicker or thinner than the above extent. As for the latest large diameter wafer over 5 inches, its thickness is from at least 500 µm to 900 µm. A monocrystal bulk silicon substrate of low oxygen concentration having large diameter over 5 inches breaks during manufacturing process if its thickness is under 200 µm. Therefore, generally, the thickness is obliged to be over 500 µm.

Then it is very effective and convenient to apply the present invention as described below referring to FIG. 11. From the beginning of manufacturing processes, the monocrystal silicon film 501 of 200–300 µm thickness and of low oxygen concentration is used. At the latter part of the manufacturing process, a semiconductor base-substrate as a backing substrate and $SiO_2$ of an SOI substrate are removed by etching and then the cathode electrode 503 such as Aluminum is formed. As a result, the semiconductor device having the monocrystal silicon film of low oxygen concentration wherein the thickness is under 200 µm, which is impossible in the prior art, is realized. This is very useful because there is no worry about a damage caused by polishing of the backside of a wafer at the last wafer process and about a decline of a yield. Furthermore, the present invention enables a $N^+$-type layer to be provided on the backside of a thin substrate of 200–300 µm thickness. As described above, it is possible to form a wafer with the most advanced fine-line process techniques so as to possess a desired resistivity and a desired thickness. So, when an output sense circuit is formed on the identical substrate with sensor elements, the image sensor can be designed using the most advanced design rule. In this application, the reinforced substrate 97 is unnecessary. As well, a semiconductor substrate except for that within a detecting region can be removed, as explained in the second application of the fourth embodiments.

Figure 17:
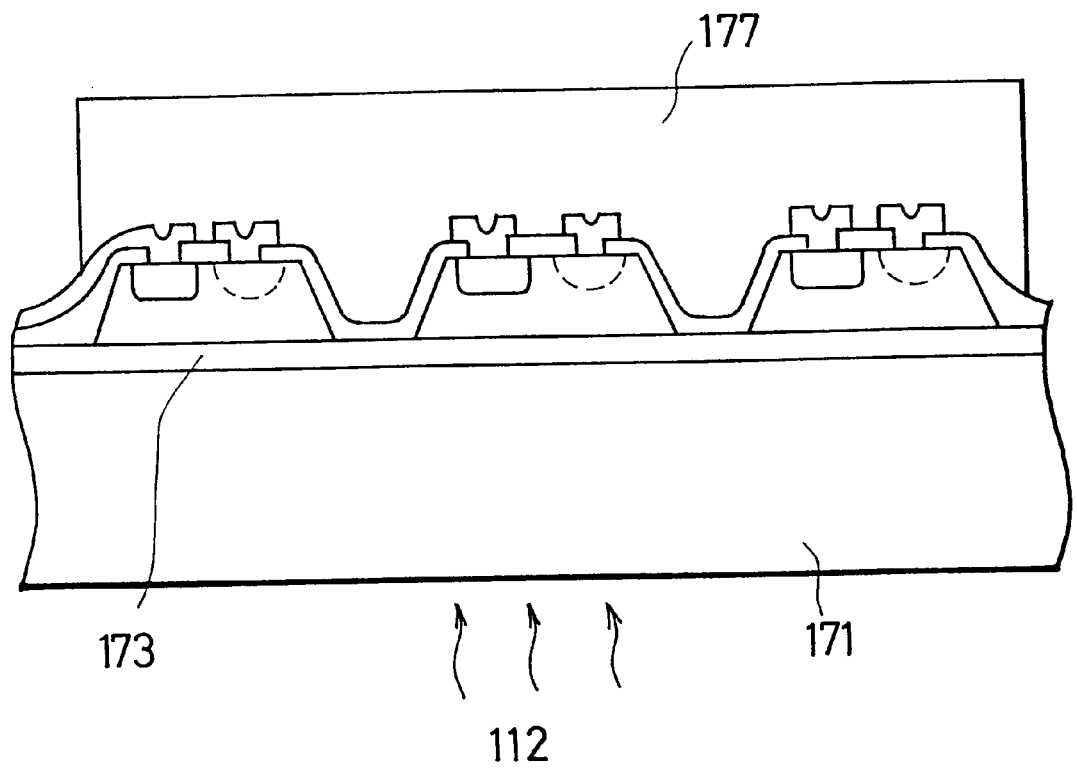
FIG. 17 is a schematic cross section showing a photodiode array which is a semiconductor device of the second application disclosed in this embodiment of the present invention.

FIG. 17 is a schematic cross section showing a photodiode array which is a semiconductor integrated circuit device of another application disclosed in the fourth embodiment of the present invention. As seen from FIG. 17, a photodiode 170 is provided on the monocrystal silicon film having low oxygen concentration. This application includes a fifth embodiment which will be explained later. The present invention enables the photodiode array to detect a radiation such as an x-ray 112 efficiently by adding a fluorescent material 171, such as $Gd_2 O_2 S:Tb$, $ZnWO_4$, $CsI:Tl$, which reacts to the radiation through a film 173 provided for fixing an interface after removing the semiconductor base-substrate and the $SiO_2$ film. A reinforced substrate 177 is provided on the silicon film in order to get mechanical destructive strength as the fluorescent material 171 is generally a thin film. This application is also effective when used with other photosensor IC such as a CCD, or a photodiode array.

Figure 10:
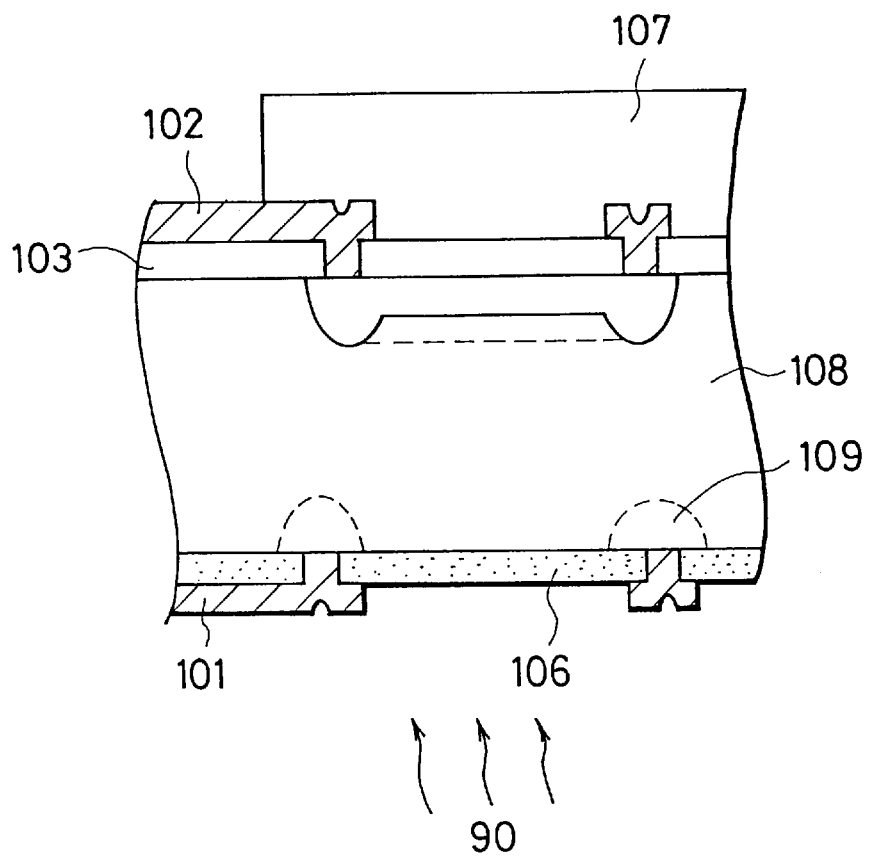
FIG. 10 is a schematic cross section showing APD which is a semiconductor device disclosed in the fifth embodiment of the present invention.

FIG. 10 is a schematic cross section showing an APD which is a semiconductor integrated circuit device of a first application disclosed in a fifth embodiment of the present invention. In FIG. 10, 102 is a cathode electrode, 107 is a reinforced substrate, 103 is an insulating film, 108 is a π layer which is made of a monocrystal silicon film having low oxygen concentration and high resistivity, 109 is a $P^+$-type layer, 101 is an anode electrode, and 106 is a SIPOS film.

Figure 21:
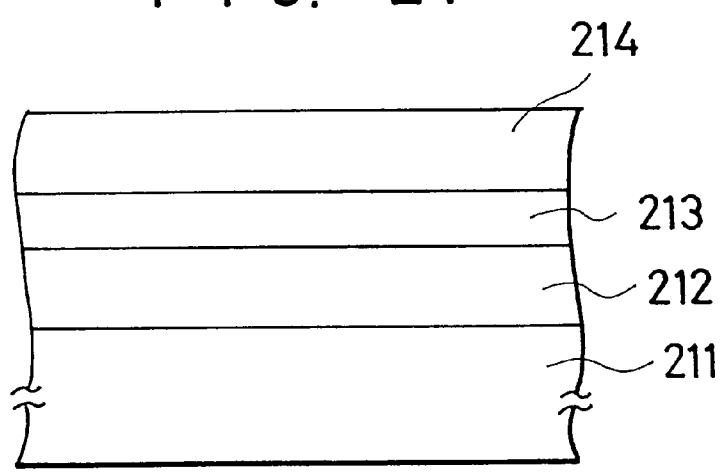
FIG. 21 is a schematic cross section showing a SOI wafer to which SIPOS is inserted, disclosed in the present invention.

A SOI substrate including a SIPOS film is added to the APD explained in the first application of the fourth embodiment. As seen from FIG. 21, the SOI substrate comprises a silicon film 214 of low oxygen concentration, a $SiO_2$ film 212, and a SIPOS film 213 provided between the silicon film 214 and the $SiO_2$ film 212. SIPOS means a semi-insulating polysilicon film. This polysilicon having high insulation is formed by introducing $O_2$ or N when the polysilicon accumulates by CVD method. The SIPOS film 213 is formed before bonding to the monocrystal silicon film 214 and after having formed the $SiO_2$ film 212. It is effective in bonding to perform micro-polishing to the surface before bonding. Otherwise the SIPOS film 213 can be formed on the silicon film 214. The latter is occasionally more convenient than the former in a characteristic of an interface. A polycrystal such as SIPOS or an amorphous material is effective in improving mechanical destructive strength against heat treatment.

The SIPOS film 106 of this embodiment, which is shown in FIG. 10, is several thousand Å in thickness and is formed so as to contact the π layer 108. The π layer remains even after the base-substrate and the $SiO_2$ film are removed, and stabilizes a surface of the π layer 108. Therefore the $P^+$-type layer 109, which is hidden from the view, is not within an irradiation region and is placed so as to encircle the irradiation region. As a result, an APD having no scattering region at all is achieved. For manufacturing the semiconductor device, any techniques stated in the fourth embodiment can be combined desirably. Preferred techniques are as follows: to provide both the anode electrode and the cathode electrode on the identical surface, to provide the window instead of the reinforced substrate on the semiconductor backing substrate, to use the transparent substrate as the backing substrate, to replace the $P^+$-type region with the $N^+$-type region for flip, and so on.

In the above embodiment, a polysilicon film can be used instead of the SIPOS film. But the SIPOS film is effective in stabilizing the surface of the $\pi$ layer 108.

Figure 16:
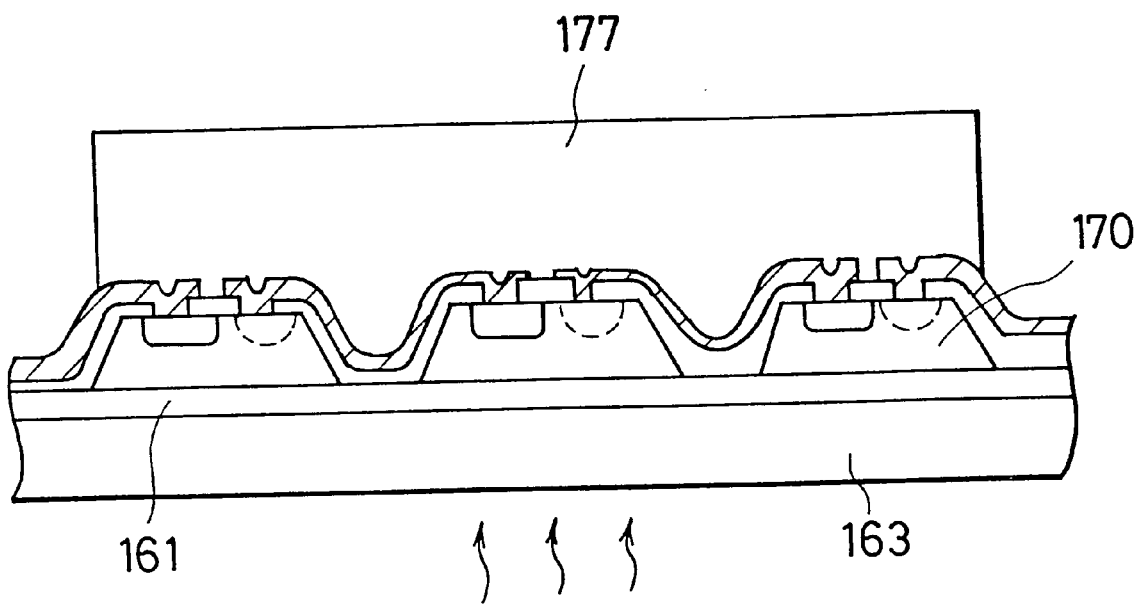
FIG. 16 is a schematic cross section showing a photovoltaic cell which is a semiconductor device of the first application disclosed in this embodiment of the present invention.

FIG. 16 is a schematic cross section showing a photovoltaic cell which is a semiconductor integrated circuit device of a second application disclosed in the fifth embodiment of the present invention. A SIPOS film 161 provided on an oxide film 163 is 300–600 Å in thickness. The SIPOS film 161 stabilizes the interface taking the place of the impurity region. At the same time, the SOPOS film 161 brings much higher photoelectric conversion efficiency because it has good transmittivity against light within wide wavelength range and further acts as an antireflection layer against an incident light. Even if the SIPOS film is polished before bonding, a polysilicon grain works to prevent reflection.

Figure 19:
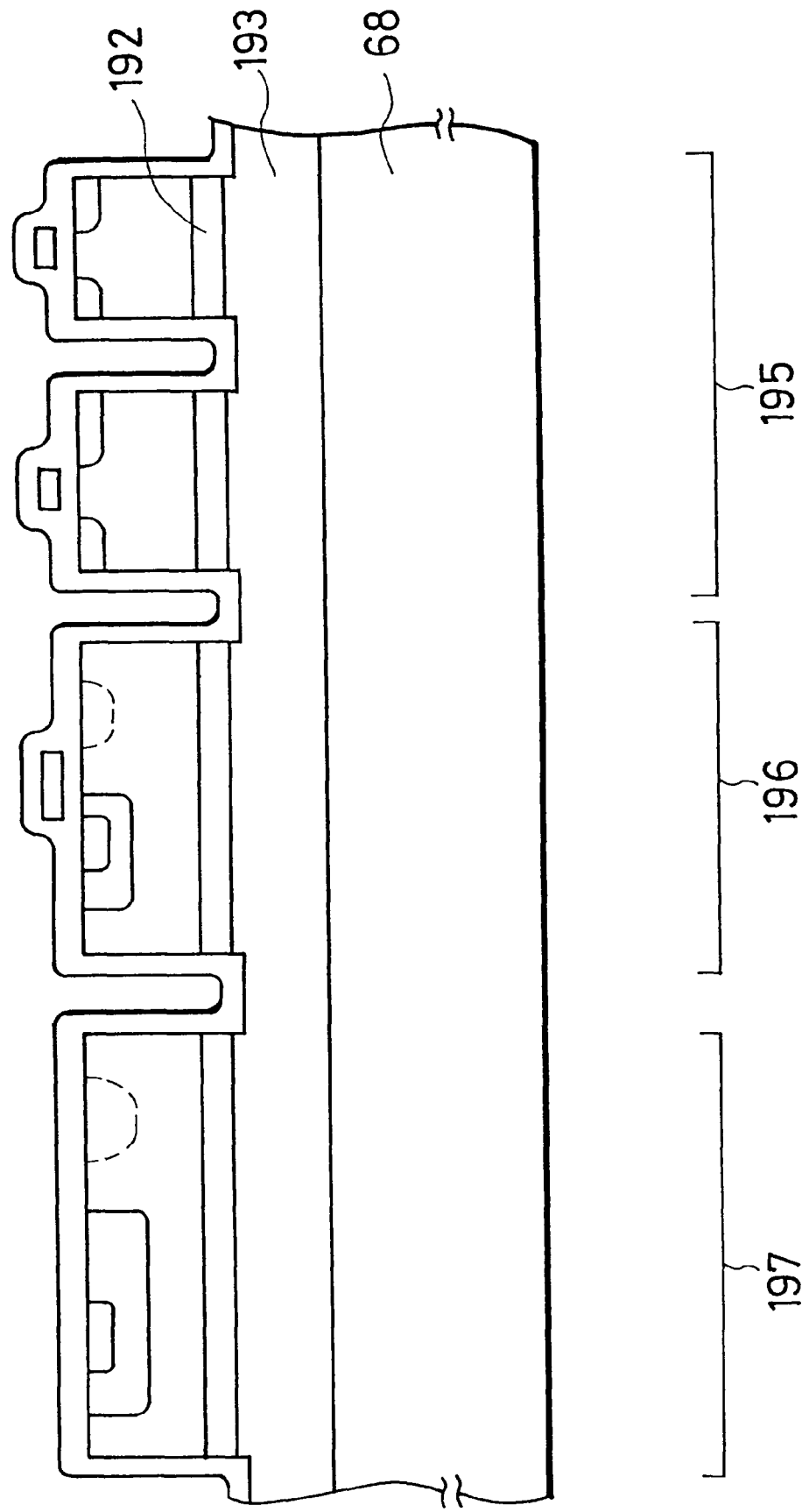
FIG. 19 is a schematic cross section showing a BiCMOSIC which is a semiconductor device of the second application disclosed in this embodiment of the present invention.

FIG. 19 is a schematic cross section showing BiCMOSIC which is a semiconductor integrated circuit device of a third application disclosed in the fifth embodiment of the present invention. A SIPOS film provided as a substitute for the $P^+$-type layer and the $N^+$-type layer stabilizes an interface between a semiconductor film and a $SiO_2$ film 193. Therefore it is unnecessary to provide regions such as $P^+$ region, $N^+$ region, according to the requirements for each element. As a result, the manufacturing process can be simplified.

Figure 18:
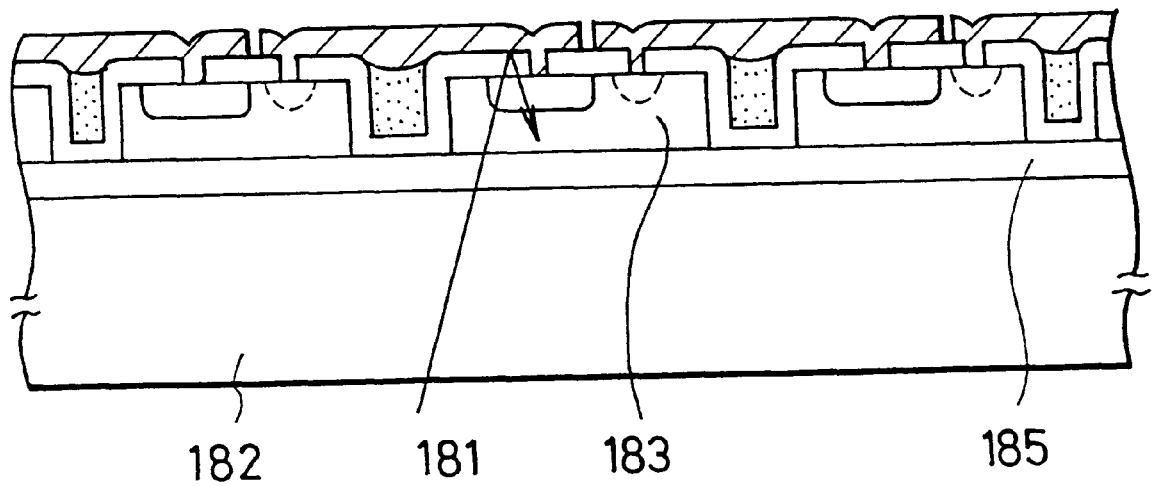
FIG. 18 is a schematic cross section showing a photovoltaic cell which is a semiconductor device disclosed in the sixth embodiment of the present invention invention.
Figure 22:
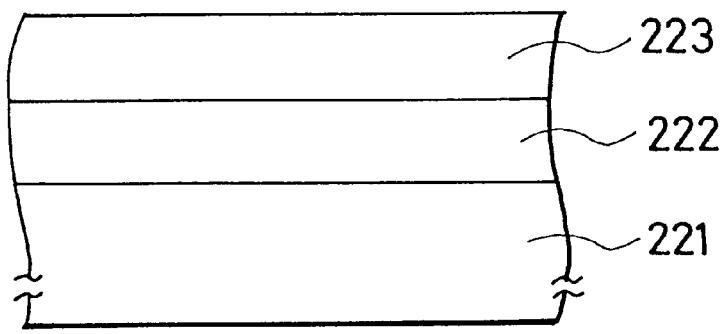
FIG. 22 is a schematic cross section showing a SOQ wafer disclosed in the present invention.
Figure 23:
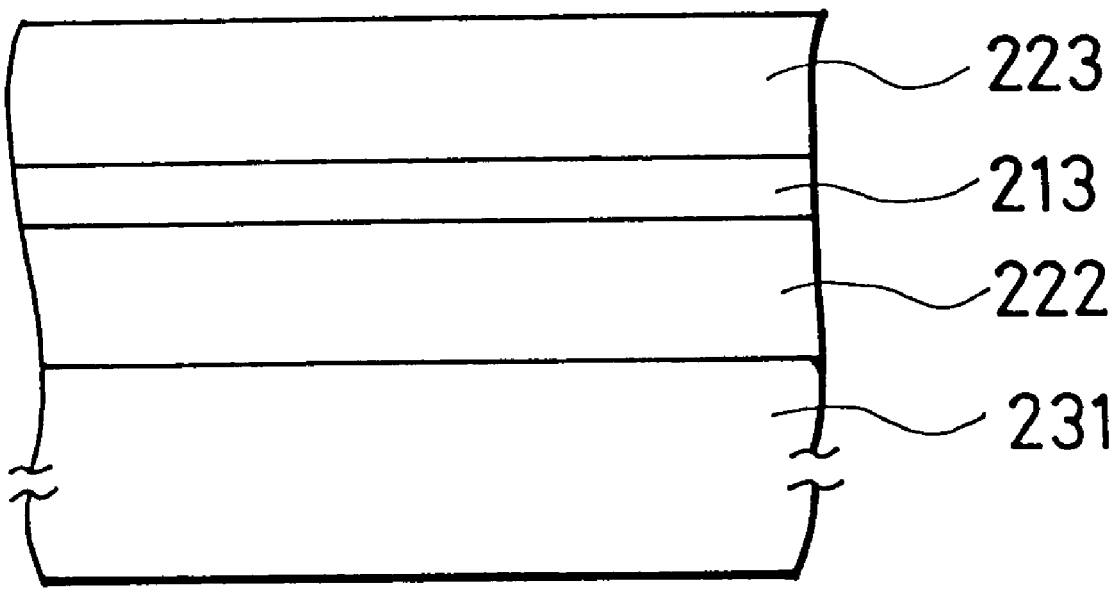
FIG. 23 is a schematic cross section showing a SOQ wafer to which SIPOS is inserted, disclosed in the present invention.
Figure 24:
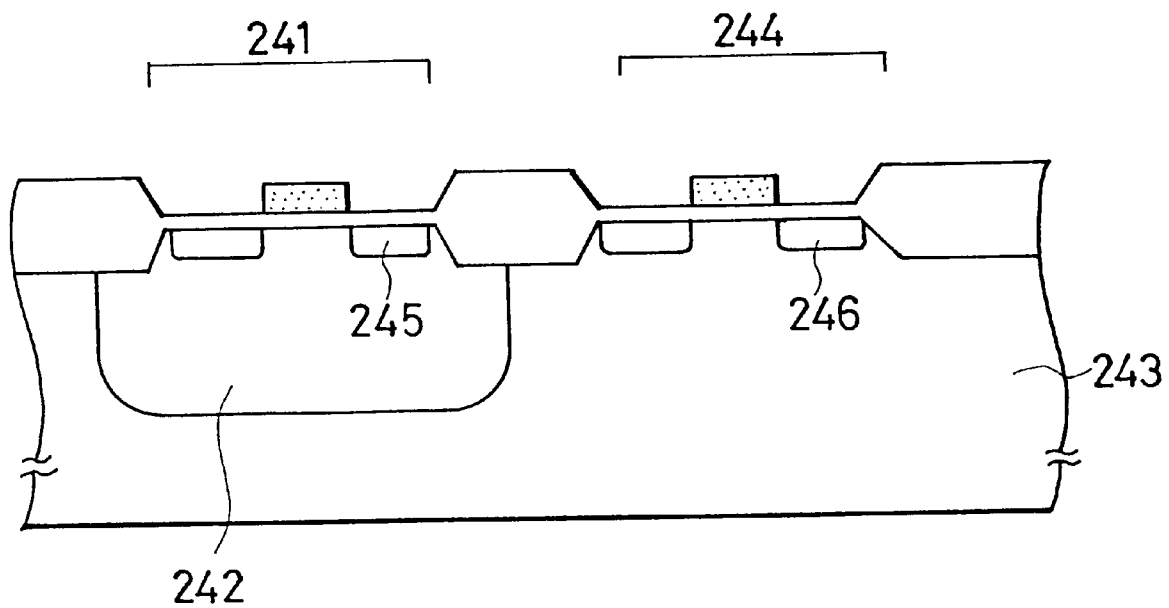
FIG. 24 is a schematic cross section showing a general CMOSIC formed on a CZ substrate which is a conventional integrated circuit device.
Figure 25:
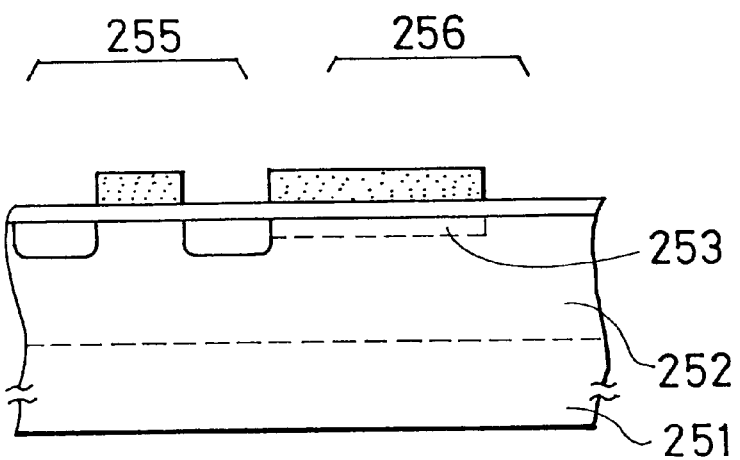
FIG. 25 is a schematic cross section showing a general DRAM cell formed on a CZ epi substrate which is a conventional integrated circuit device.

FIG. 18 is a schematic cross section showing a photovoltaic cell which is a semiconductor integrated circuit device disclosed in a sixth embodiment of the present invention. As seen from FIG. 18, a photovoltaic cell 183 is provided on a backing substrate through a SIPOS film 185 so as to include a monocrystal silicon film of low oxygen concentration. A SOI substrate applied in this embodiment includes not only the photovoltaic cell explained in the first application of the fifth embodiment but also a monocrystal silicon film 223 having low oxygen concentration shown in FIGS. 22–23. Furthermore, a base-backing substrate portion 221 constituting the SOI substrate is made of a quartz substrate. In FIG. 22, an oxide film 222 is provided on a surface of the quartz 221. However, in this embodiment, there is no need to provide the oxide film 222 as quartz is made of an oxide film.

As stated above, it is possible to detect an incident light 181 coming from a backside in order to get high photoelectric conversion efficiency. Here, it is not necessary to provide a reinforced substrate and remove a base-substrate in the middle of a manufacturing process. Therefore, not only is the process shortened but also a decline of yield caused by providing the reinforced substrate and removing the base-substrate is prevented. The substrate can be made of other materials than quartz only if it is transparent against the incident light. This embodiment is also useful if combined with other photosensor IC such as a CCD, or a photodiode array.

The first–sixth embodiments are explained above. The second–sixth embodiments can be usefully performed independently of the first embodiment. The following, which doesn't cover all, is the effects of a device having a semiconductor film: in accordance with the present invention latch-up resistance and radiation resistance improve in CMOSIC; high sensitivity and high efficiency about separating method and detecting method are obtained in photosensor IC such as a CCD, or a photovoltaic cell; characteristics improve and manufacturing process is simplified in BiCMOSIC; and so on. As stated above, an FZ substrate having high electric resistivity includes some troubles about cost, delivery, enlarging wafer size, and so on. So, in order to perform this embodiment, a CZ-SOI substrate is usefully used according as necessary performance and cost.

As explained above, the present invention brings the following effects.

As for a structure of semiconductor substrate in a semiconductor integrated circuit device, the present invention applies a semiconductor substrate comprising a monocrystal silicon film having low oxygen concentration, a backing substrate, and an insulating film such as $SiO_2$, wherein the monocrystal silicon film is provided on the backing substrate through the insulating film. (This substrate is called SOI substrate below.) In the above structure, the monocrystal silicon film having low oxygen concentration is separated completely from the backing base-substrate and so the monocrystal silicon film keeps its good points which is used to have before polishing even after the manufacturing process done. As a result, the increase of defects caused by educed oxygen is depressed and good yield is obtained in CMOSIC, DRAM, CCD, and BiCMOSIC. Besides, the decline of carrier lifetime is depressed and good characteristics is obtained in DRAM, CCD, and BiCMOSIC. If the backing substrate is removed after a semiconductor element is formed, a thin film semiconductor device is realized.

As well, it is expected that radiation resistance also improves remarkably in whole IC because the monocrystal silicon film is separated completely from the base-substrate. The base-substrate has oxygen concentration more than $10^{18}$ atoms/cm$^3$ and so has high mechanical destructive strength. Therefore troubles about physical strength as stated above do not occur even after the manufacturing process of the semiconductor integrated circuit device. In photosensor IC, light which has passed through a detecting portion can be used by means of reflection from an interface between a base $SiO_2$ and a semiconductor base-substrate. Therefore sensitivity and efficiency improve.

Since separation of each element forming the semiconductor integrated circuit device reaches the base $SiO_2$, each element is separated completely and latch-up is eliminated perfectly from whole CMOSIC. In CCD and whole photosensor IC, it can be completely eliminated that carrier of an element unnecessarily get into adjacent elements. As well, BiCMOSIC manufacturing process is greatly simplified as epi process is not repeated many times. Similarly, it is not necessary to use a dielectric isolation substrate in a photovoltaic cell and so on, therefore, time and cost are greatly reduced and further wafer size can be enlarged. High voltage, high efficiency, and so on are also gained.

A thin impurity layer of $N^+$-type or $P^+$-type is provided at the lower part of the monocrystal silicon concentration having high electric resistivity and low oxygen concentration so as to touch the base $SiO_2$ and so an interface between the silicon film and the base $SiO_2$ becomes stable. Therefore, well-known backchannel, which is characteristic of a SOI transistor of a MOS transistor, can be prevented in CMOSIC and so on. In BiCMOSIC, such a thin impurity layer functions as a buried region instead and so good characteristics can be obtained. Similarly, in a photodiode array and a photovoltaic cell, an interface becomes stable and series resistance is reduced. In APD and so on, a $\pi$ layer can get high electric resistivity while an epitaxial layer cannot get. Thickness of APD is easily set from several dozens $\mu$m to several hundred $\mu$m if necessary. Furthermore, since conventional heat treatment such as an epitaxial process is not performed, a P⁺-type layer does not diffuse to the π layer so much and so a scattering region is absolutely small.

A SIPOS film is formed between the semiconductor film of low oxygen concentration and the $SiO_2$ film which prevents oxygen diffusion. Then the following effects are obtained: In a MOS transistor and a bipolar transistor, an interface becomes stable and further its process is simplified as it is unnecessary to provide regions such as a P⁺ region, a N⁺ region according to the requirements for each element; In APD and so on, an interface also becomes stable and further a scattering region is completely eliminated as a P⁺ region is no more necessary; In a photovoltaic cell and so on, the SIPOS film stabilizes an interface instead of other impurity regions and further acts as a reflection prevention film against an incident light, therefore higher photoelectric conversion efficiency is obtained.

In the latter part of the manufacturing process of the semiconductor integrated circuit device, some reinforced substrate is formed on the monocrystal silicon film and then the semiconductor base-substrate is removed by means of etching, grinding, polishing, and so on. As a result, the APD having the monocrystal silicon film under 200 μm in thickness can be realized. The APD and so on can detect an incident ray which comes from its backside and so can detect even an x-ray having very low energy under a certain value such as 10 keV without experiencing any loss. The photodiode array and the photovoltaic cell can also detect the incident ray from their backsides and so can receive the incident ray with greater efficiency as the incident light is not blocked out by their own electrodes and so on.

The present invention applies a transparent substrate, such as a quartz substrate, instead of a semiconductor substrate for the role of a backing substrate in the SOI substrate. Therefore the APD, the photodiode array, and the photovoltaic cell can detect the incident ray which comes from their backsides without removing a substrate once. As a result, not only is the process shortened but also the decline of yield caused by providing a reinforced substrate and removing the base-substrate can be prevented. As well, the backing substrate in the present invention is made of a polycrystal or an amorphous material, not a monocrystal material. Therefore the inventive semiconductor device can not only be of high mechanical destructive strength but can also be economical.

What is claimed is:

1. A photosensitive semiconductor device comprising:
    a monocrystalline silicon layer having an oxygen concentration less than $10^{17}$ atoms/cm³;
    an insulating layer disposed on a first surface of the monocrystalline silicon layer;
    a first conductive layer disposed on the insulating layer;
    a semi-insulating polycrystalline silicon layer disposed on a second surface of the monocrystalline silicon layer to stabilize the second surface and to minimize a scattering region;
    a second conductive layer disposed on the second surface of the monocrystalline silicon layer; and
    a photosensitive element formed in the monocrystalline silicon layer.

* * * * *